United States Patent [19]

Miyoshi et al.

[11] Patent Number: 5,007,044
[45] Date of Patent: Apr. 9, 1991

[54] DIGITAL ADAPTIVE FILTER AND METHOD OF CONVERGENCE THEREIN

[75] Inventors: Seiji Miyoshi, Yokohama; Misao Fukuda, Tokyo; Seiichi Yamato, Fukuoka; Kouji Tokiwa, Atsugi; Kazuyoshi Maruyama, Yokohama, all of Japan

[73] Assignee: Fujitsu Limited, Kawasaki, Japan

[21] Appl. No.: 382,413

[22] Filed: Jul. 20, 1989

[30] Foreign Application Priority Data

Jul. 20, 1988 [JP] Japan .................. 63-180565
Apr. 28, 1989 [JP] Japan .................. 01-111664

[51] Int. Cl.⁵ ............................ H04B 3/20
[52] U.S. Cl. ...................... 370/32.1; 379/411
[58] Field of Search ........... 370/32.1; 379/410, 411; 364/724.16

[56] References Cited

U.S. PATENT DOCUMENTS

| | | | |
|---|---|---|---|
| 4,571,719 | 2/1986 | Carlquist et al. | 370/32.1 |
| 4,605,826 | 8/1986 | Kanemasa | 370/32.1 |
| 4,621,173 | 11/1986 | Guidoux | 370/32.1 |
| 4,811,342 | 3/1989 | Huang | 370/32.1 |
| 4,823,382 | 4/1989 | Martinez | 370/32.1 |
| 4,868,874 | 9/1989 | Takatori et al. | 370/32.1 |

FOREIGN PATENT DOCUMENTS 59-211338 11/1984 Japan .
62-291223 12/1987 Japan .
63-173422 7/1988 Japan .

Primary Examiner—Douglas W. Olms
Assistant Examiner—Melvin Marcelo
Attorney, Agent, or Firm—Staas & Halsey

[57] ABSTRACT

Disclosed is a digital adaptive filter and a method of cancelling an echo component generated by a partial return of a transmission signal to a receiving side. The digital adaptive filter comprises: a main memory unit for storing a first echo replica which can be stored or read by using the parallel signal from a main tap unit as an address signal, at least one submemory unit for storing a second echo replica which can be stored or read by using the parallel signal from said subtap unit as an address signal, and an adding circuit for adding the first echo replica and the second echo replica. The second echo replica stored in the at least one submemory unit has a greater precision than the precision of the first echo replica stored in the main memory unit, and thus the accumulated error due to memory division can be reduced. Instead of or accompanied by the greater precision, the contents of the main memory are updated directly based on the error between the pseudo signal and an input signal or based on a step size corresponding to the error, depending on whether the error is relatively large or relatively small, respectively.

28 Claims, 17 Drawing Sheets

DATA TRANSMITTING AND RECEIVING
PORTION FOR BIDIRECTIONAL
SIMULTANEOUS DATA COMMUNICATION

TRANSVERSAL TYPE ECHO CANCELER

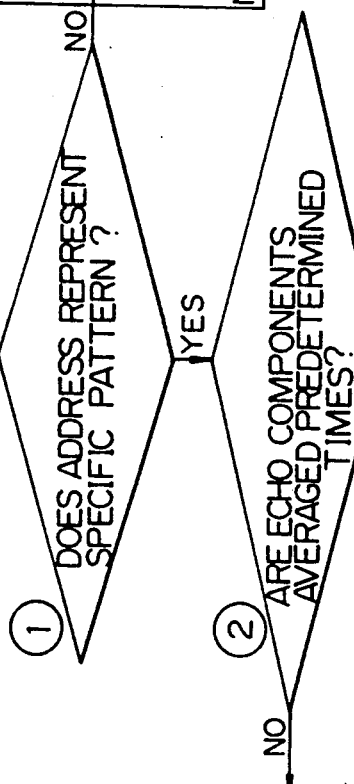

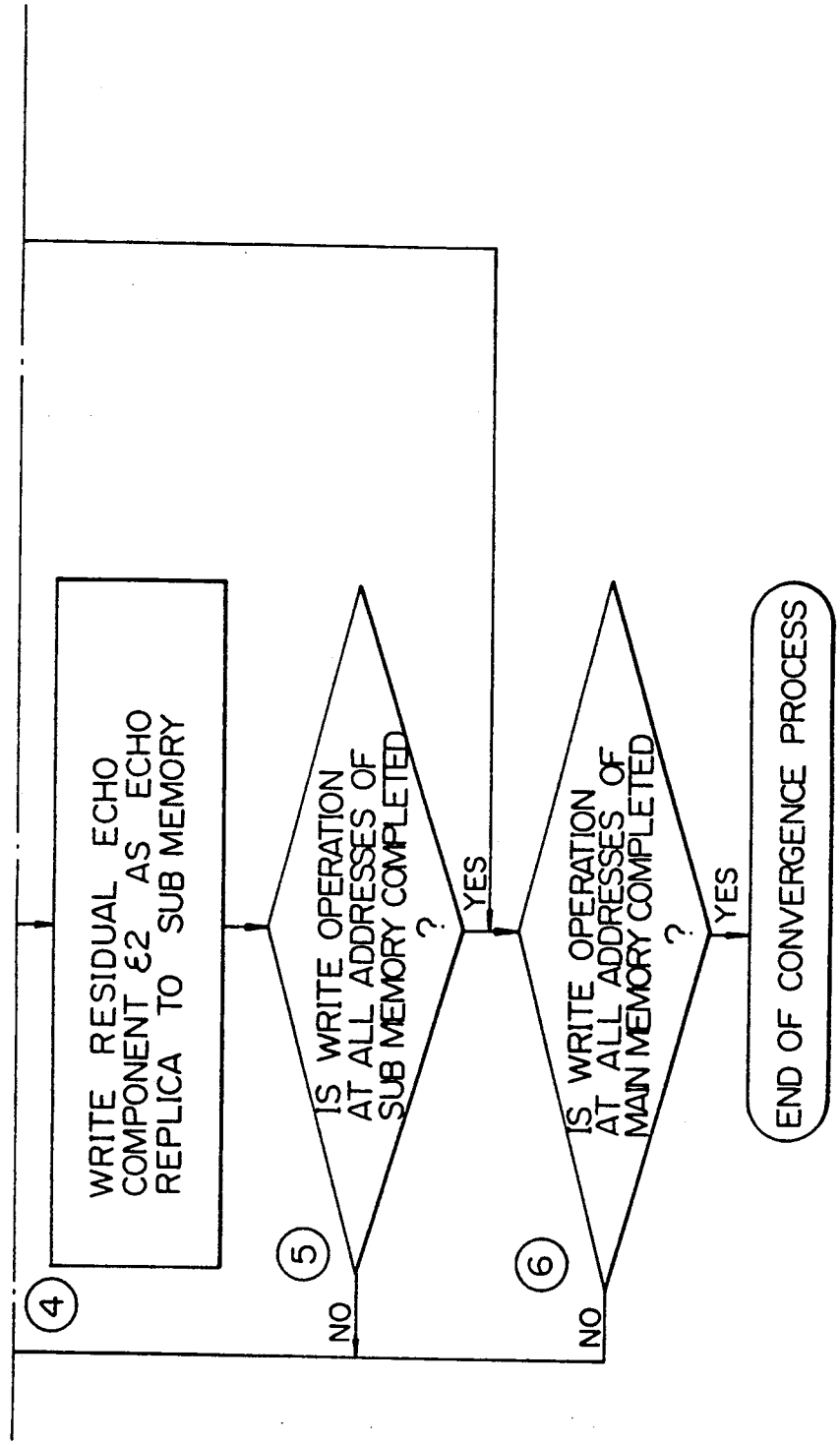

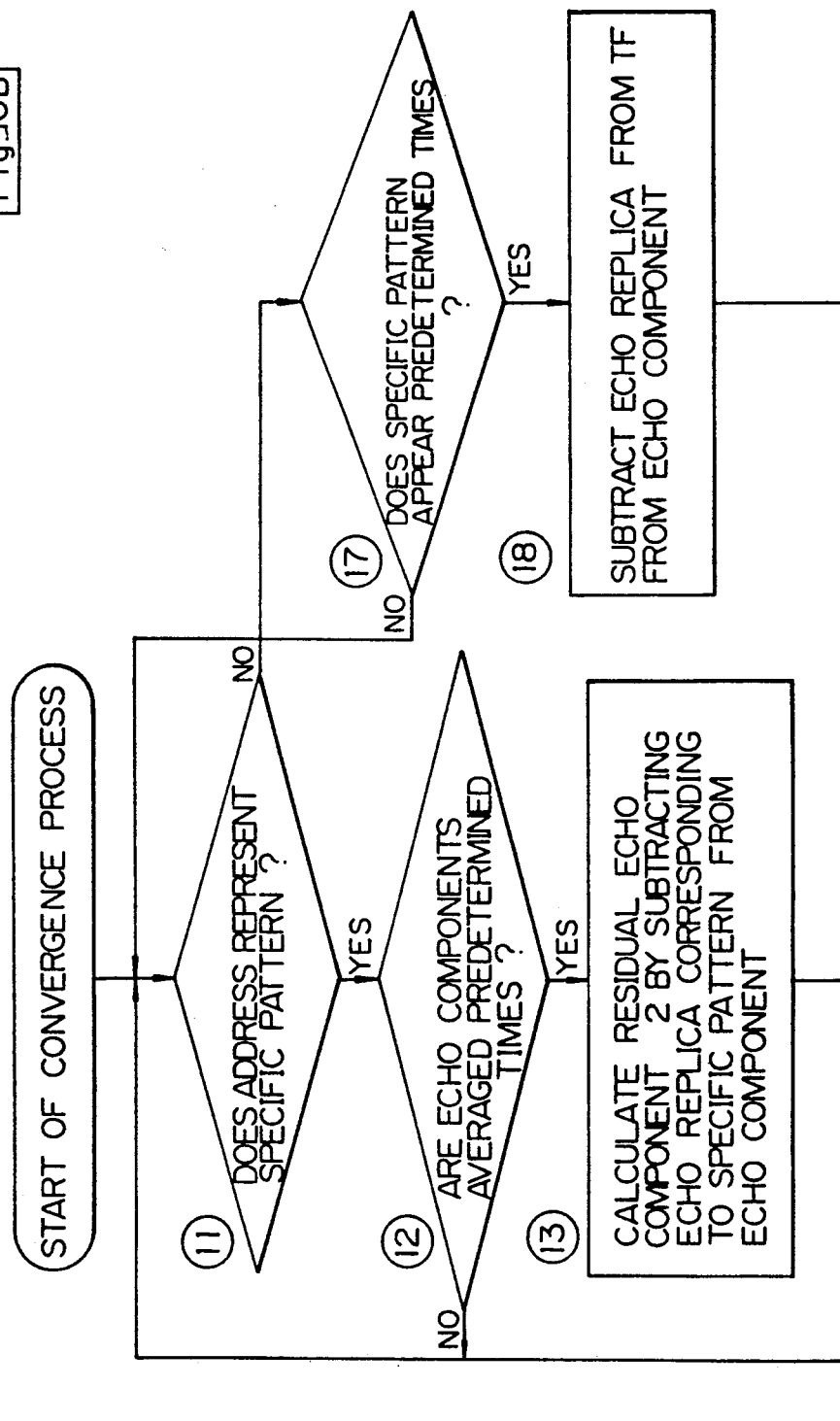

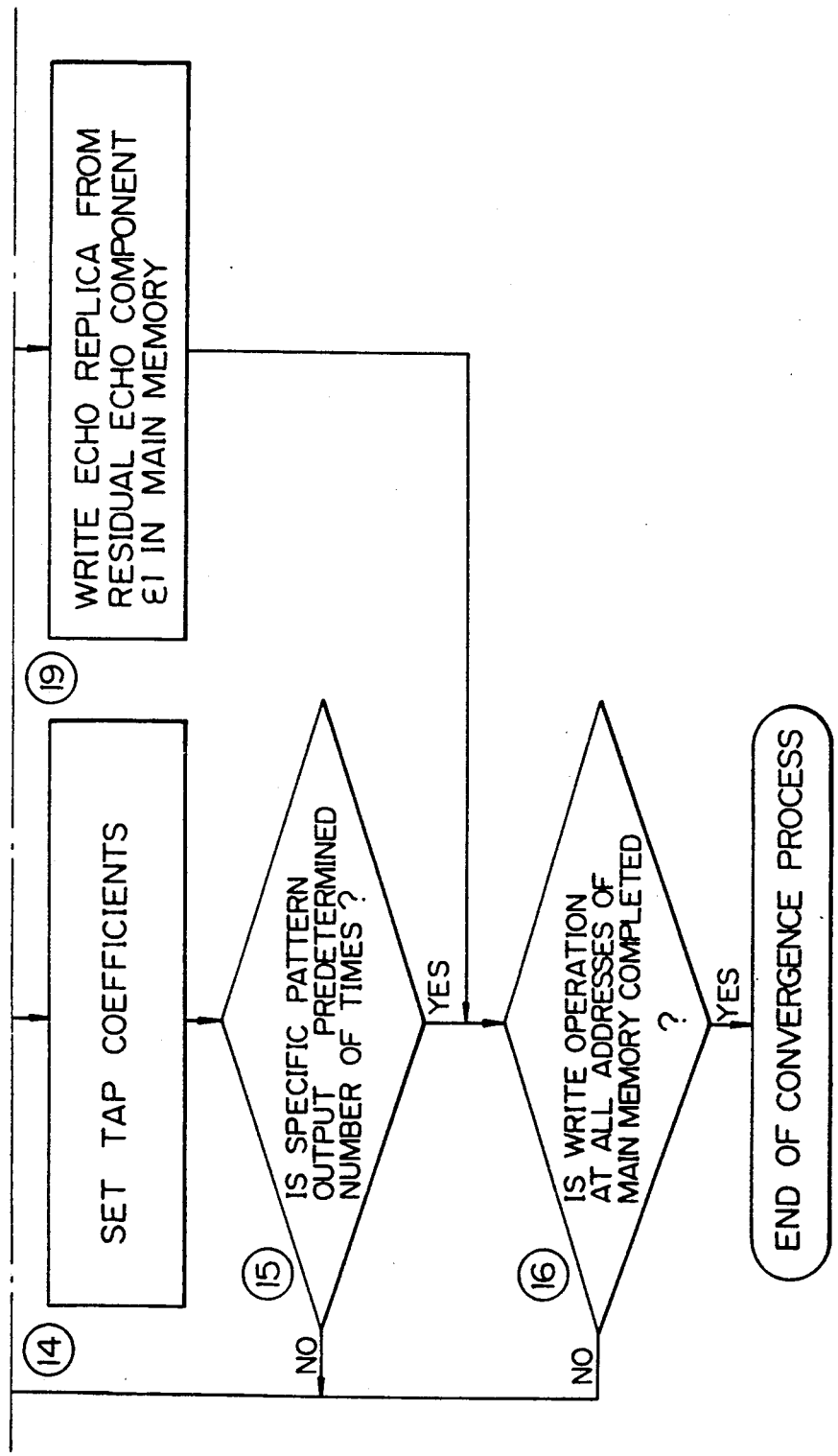

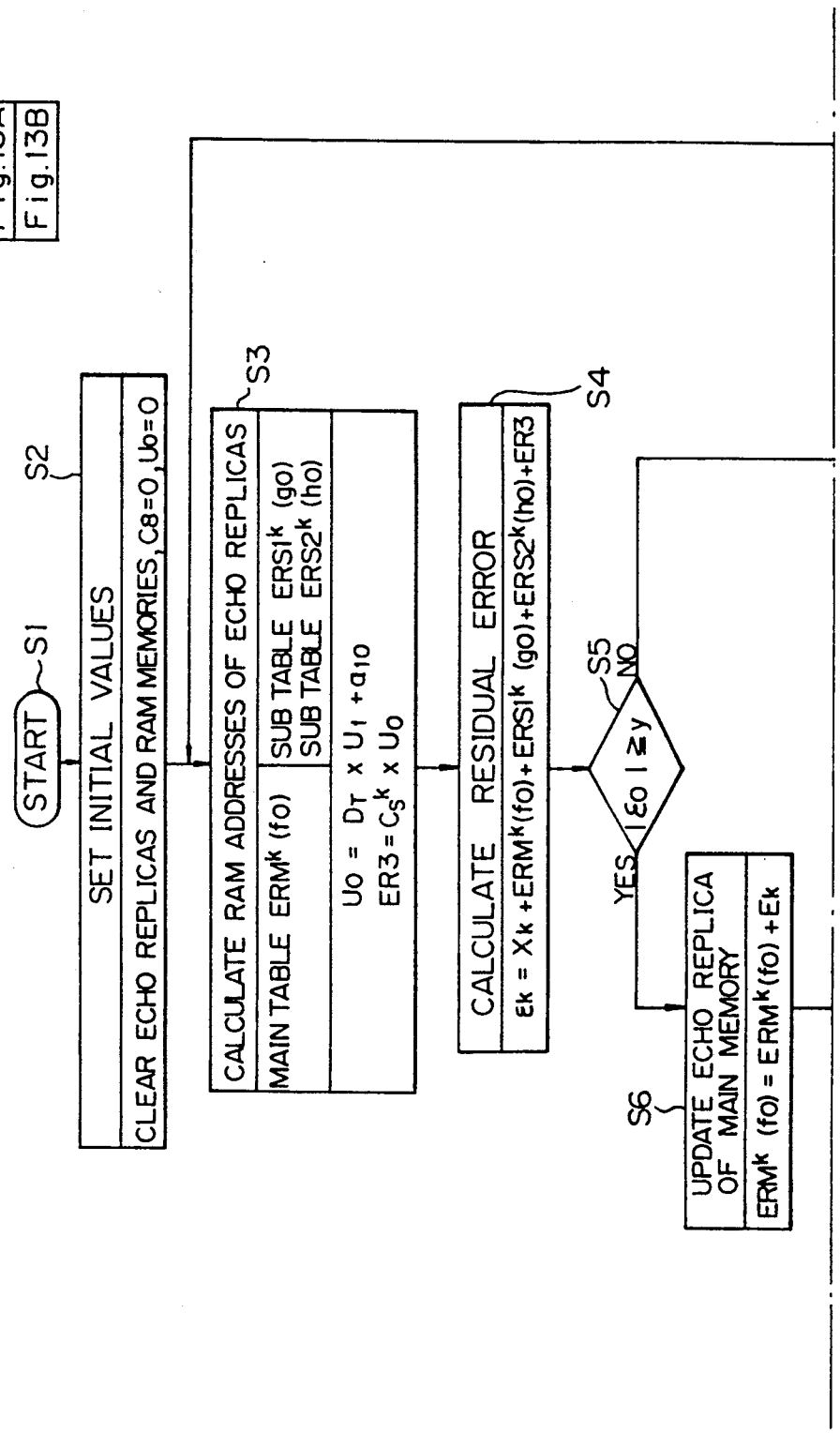

DIGITAL ADAPTIVE FILTER AND METHOD OF CONVERGENCE THEREIN

BACKGROUND OF THE INVENTION

1. Field of the Invention

The present invention relates to a a digital adaptive filter and method of convergence therein. More particularly, it relates to an apparatus and a method for cancelling an echo component generated by a partial return of a transmission signal to a receiving side by a digital adaptive filter.

When a bidirectional data transmission is effeted through a hybrid circuit, the transmission signal is partially returned to the receiving side through the hybrid circuit to thereby cause a reception error, and therefore, the echo component generated by the partial return of the transmission signal to the receiving side must be cancelled.

2. Description of the Related Arts

A digital adaptive filter is used to cancel the echo component, and conventional digital adaptive filters are classified into two types, i.e., a look-up table type echo canceller and a transversal filter type echo canceller.

In the look-up table type echo canceller, a sequence of transmission signals is guided to a tap portion, and a pattern of the sequence of signals is used as an address when storing in a memory portion a sequence of pseudo echoes having an opposite polarity to an echo value. Accordingly, if an echo of the same address subsequently input, the echo is cancelled by the pseudo echo stored in the memory.

The transversal filter type echo canceller employs a known transversal filter to converge the input signal. One tap coefficient is provided N pieces of input data, and according to the pattern of the tap coefficients and transmission symbols, pseudo echoes are generated to cancel echoes.

The look-up table type echo canceller is advantageous for cancelling non-linear echo components, but the memory capacity thereof must be increased as the tap length of an echo becomes longer, thus causing a disadvantage in that an initial convergence time (a training time) may become longer. Particularly this disadvantage will be serious when multivalued codes are employed as transmission codes.

The transversal filter type echo canceller is advantageous in that echoes having long tap lengths are cancelled within a short convergence time, but has a disadvantage in that non-linear echo components cannot be cancelled thereby.

Therefore, the above digital filters are rarely employed to cancel echoes containing non-linear components and having relatively long tap lengths.

To cope with this problem, a memory division type digital filter having a look-up table memory divided into a main memory portion and a plurality of submemory portions was provided prior to the present invention.

The memory division type digital filter ebables a reduction of the memory capacity, as described in more detail later with reference to the drawings, but this arrangement incurs a division loss, i.e., an accumulated error appearing as a residual echo component.

It may be considered to combine the above memory division type filter with the transversal filter type echo canceller, but in this combination a suitable converging algorithm that can accurately carry out the initial convergence and adaptive control is not known.

SUMMARY OF THE INVENTION

Accordingly, a first object of the present invention is to provide an apparatus and a method for cancelling an echo component in a memory division type digital filter having a reduced memory capacity and able to suppress any residual echo component is suppressed.

A second object of the present invention is to provide an apparatus and a method for cancelling an echo component in a combination of a memory division digital filter and a transversal filter, in which a convergent algorithm is provided that can accurately carry out the initial convergence and adaptive control at a high speed.

To realize the first object, according to the present invention there is provided a digital adaptive filter for cancelling an echo component generated by a partial return of a transmission signal to a receiving side, comprising: a tap unit for sequentially shifting the transmission signal and outputting the shifted signal in parallel, the tap unit being divided into a main tap unit and at least one subtap unit; a main memory unit, operatively connected to the main tap unit, for storing a first echo replica which can be stored or read by using the parallel signal from the main tap unit as an address signal; at least one submemory unit, operatively connected to the at least one subtap unit for storing a second echo replica which can be stored or read by using the parallel signal from the subtap unit as an address signal; and an adding circuit, operatively connected to the main memory unit and the submemory unit, for adding the first echo replica read from the main memory unit and the second echo replica read from the submemory unit.

The second echo replica stored in the submemory unit having a precision greater than the precision of the first echo replica stored in the main memory unit.

BRIEF DESCRIPTION OF THE DRAWINGS

The above objects and features of the present invention will be more apparent from the following description of the preferred embodiments with reference to the accompanying drawings, wherein:

FIGS. 8, 8A and 8B show a flowchart explaining the calculation of the average echo components according to another embodiment of the present invention;

FIGS. 10, 10A and 10B show a flowchart explaining the calculation of the average echo components in the embodiment shown in FIG. 9;

FIGS. 13, 13A and 13B show a flowchart explaining the process in the embodiment shown in FIG. 12.

DESCRIPTION OF THE PREFERRED EMBODIMENTS

For a better understanding of the present invention, conventional echo cancelling methods and apparatus will first be described with reference to FIGS. 1 to 4.

Figure 1:
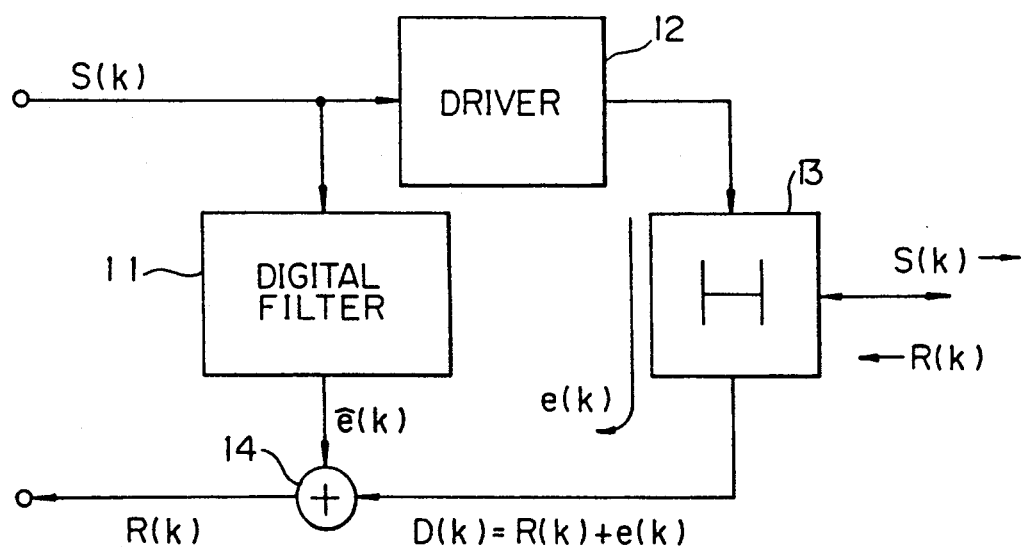
FIG. 1 is a block diagram showing an essential part of a data transmission portion of a conventional bidirectional simultaneous data communication system.

FIG. 1 is a block diagram showing a main part of a data transmission/reception unit wherein numeral 11 denotes a digital filter constituting an echo canceller; 12 a driver; 13: a hybrid circuit; and 14 an adder. A transmission signal S(k) from a transmission unit (not shown) is sent from the driver 12 to a transmission line such as a subscriber line, through the hybrid circuit 13, and reception data R(k) received through this transmission line is supplied to a receiver (not shown) through the hybrid circuit 13.

In this case, the transmission data S(k) is partially returned to the receiving side through the hybrid circuit 13, thereby generating an echo component e(k), and this echo component e(k) is superposed on the reception data R(k). Namely, a signal D(k) output from the hybrid circuit 13 to the receiving side becomes $D(k) = R(k) + e(k)$, and when the signal D(k) is applied to the receiver, a reception error occurs.

To eliminate the above error, an echo replica ê(k) of the echo component e(k), which echo replica ê(k) should be the same as $-e(k)$, is generated by the digital filter 11 using the transmission data S(k) and is applied to the adder 14, and the adder 14 carries out a calculation $D(k) - e(k) = R(k) + e(k) - ê(k)$, to thereby cancel the echo component e(k), and therefore, only the reception data R(k) is applied to the receiver.

Figure 2:
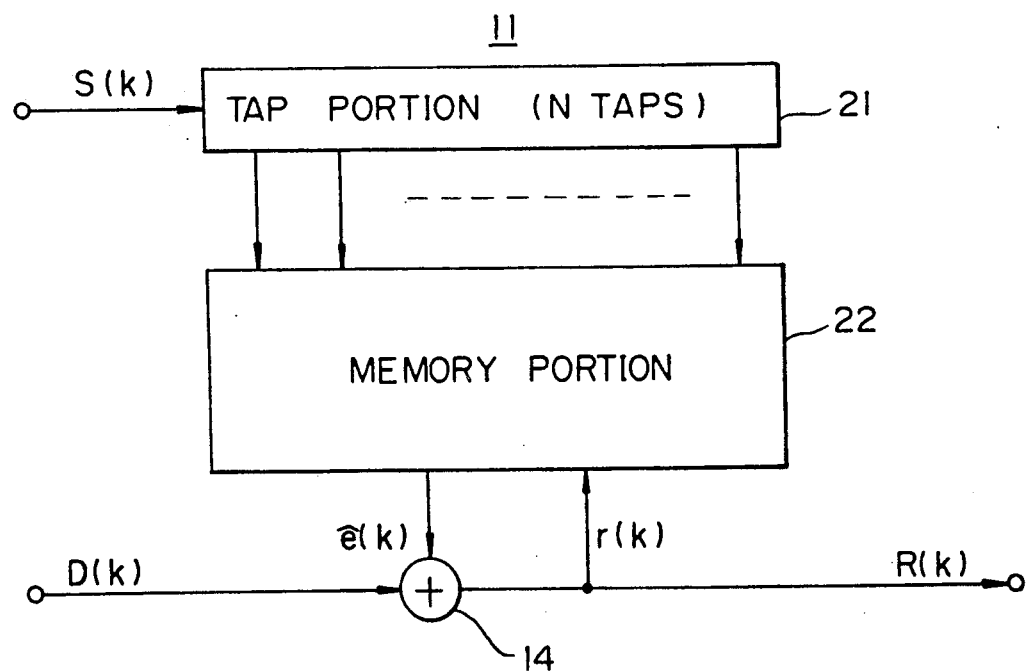
FIG. 2 is a block diagram showing a conventional look-up table type echo canceller.

The digital filter 11 may have the arrangement exemplified in FIG. 2. As shown in the figure, the transmission data S(k) is input to a tap unit 21 including a shift register with a plurality of 1-bit delay circuits (not shown) and is sequentially shifted, parallel output pulses are respectively output from the corresponding taps, and the resultant parallel signal serves as an address signal for a memory unit 22. The number of taps in the tap unit 21 corresponds to the characteristics of the echo component e(k), and the memory unit 22 includes a random access memory (RAM) and a controller.

At the time of a convergence, the echo replica ê(k) is written in the memory unit 22 in such a way that the residual echo component r(k), which is a difference between the echo component e(k) input through the hybrid circuit 13 and the echo replica ê(k) read out from the memory unit 56, becomes zero, and when echo replicas ê(k) are written to all addresses of the memory unit 22, the conversion process is completed. When the next data transmission/reception is performed, the echo replica ê(k) corresponding to the pattern of the transmission data S(k) is read out and supplied to an adder 14. The adder 14 cancels an echo component contained in the reception data D(k) from the hybrid circuit, and the reception data R(k) having a zero residual echo component r(k) is transferred to the receiver.

The number n of taps of the tap unit 21 corresponds to the characteristic of the echo replica e(k), i.e., a length of received data influenced by the echo component e(k) returned from the hybrid circuit to the receiving side, and therefore, the capacity of the memory unit 22 is increased in proportion to $2^n$, and the initial converging time is increased accordingly. In a transmission scheme using a 2B1Q code (four-value code in which 2-bit codes of 10, 11, 01, and 00 correspond to four levels $+3$, $+1$, $-1$, and $-3$ respectively), the capacity of the memory unit 22 is increased in proportion to $4^n$.

The look-up table type echo canceler is advantageous for cancelling non-linear echo components, but as described above, memory capacity thereof must be increased as the tap length of an echo becomes longer, thus bringing a disadvantage in that an initial convergence time (a training time) may become longer. Particularly, this disadvantage is serious when multivalued codes are employed as transmission codes.

Figure 3:
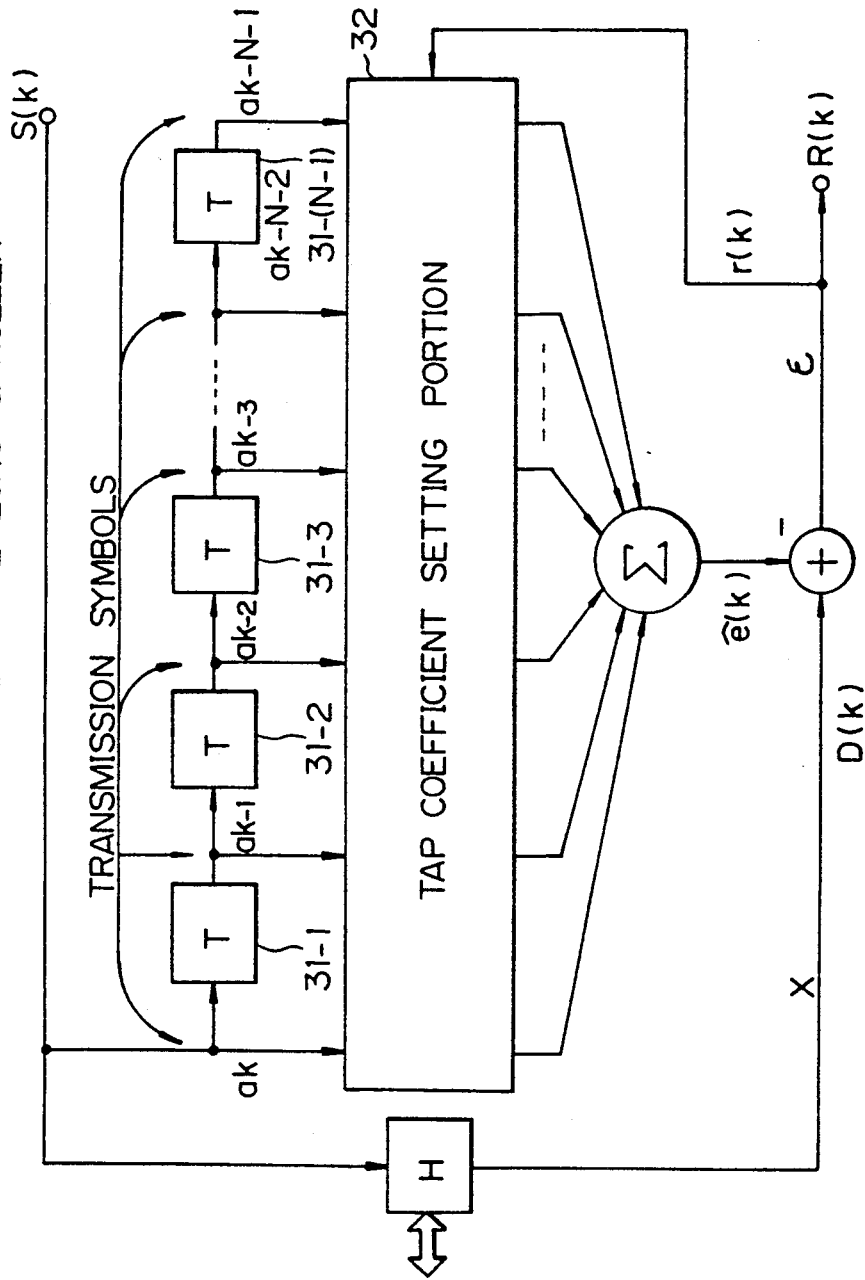
FIG. 3 is a block diagram showing a conventional transversal type echo canceller.

In another example, the digital filter 11 shown in FIG. 1 is realized by a conventional transversal filter type echo canceler shown in FIG. 3 which employs a known transversal filter to converge the input signal. One tap coefficient is provided for N pieces of input data, and pseudo echoes {ê(k)} are generated to cancel echoes, according to the pattern of the tap coefficients and transmission symbols.

The conventional transversal filter type echo canceller is advantageous for efficiently cancelling echoes having long tap lengths within a short convergence time, but has a disadvantage in that non-linear echo components cannot be cancelled thereby.

Therefore, the above digital filters are rarely employed to cancel echoes that contain non-linear components and have relatively long tap lengths. To cope with this problem, a memory division type digital filter as shown in FIG. 4 is conventionally provided.

Figure 4:
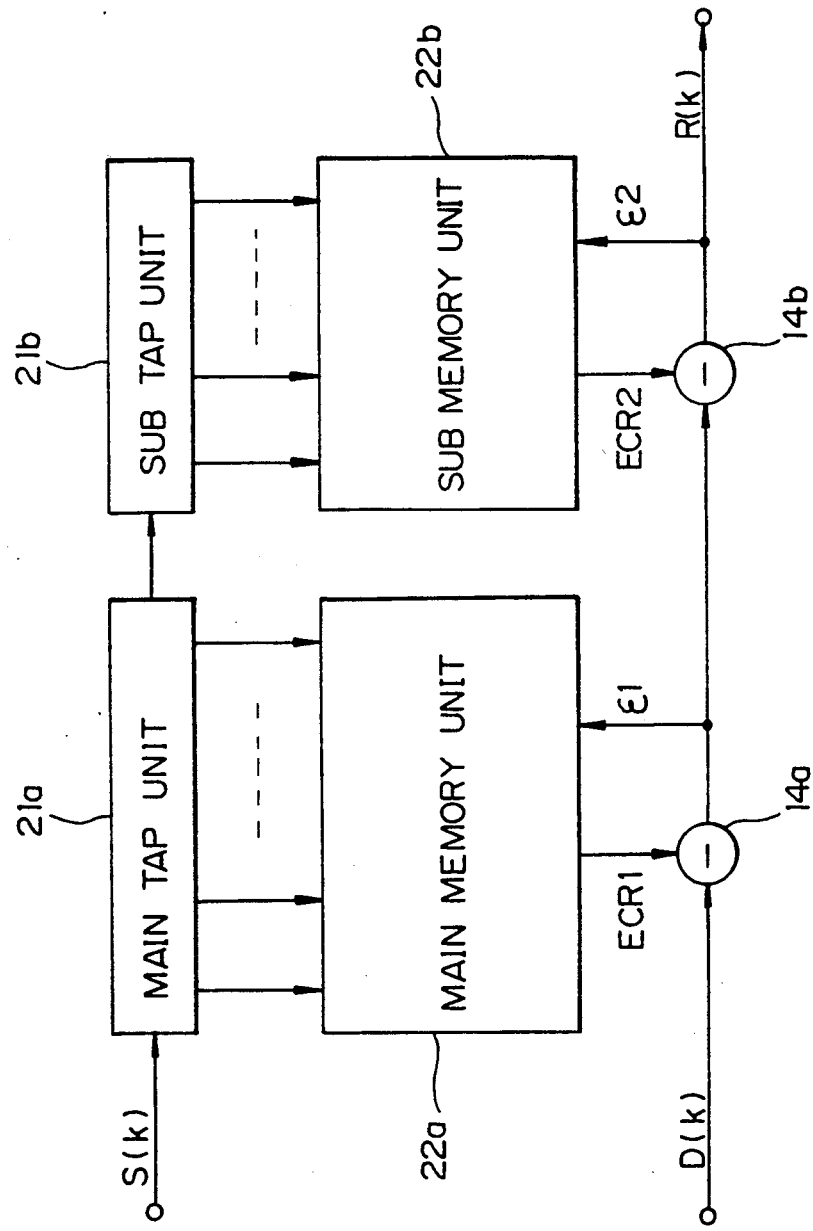
FIG. 4 is a block diagram showing a conventional memory division type echo canceller.

In FIG. 4, a tap unit having n taps receiving the transmission signal S(k) is divided into a main tap unit 21a having k taps and k 1-bit delay circuits (not shown) and a subtap unit 21b having (n−k) taps, and the memory unit is divided into a main memory unit 22a for receiving an address signal from the main tap unit 21a and a submemory unit 21b for receiving an address signal from the subtap unit 21b. An echo replica ECR1 from the main memory unit 22a and the reception data D(k) are added to an adder 14a, a residual echo component ε1 of an output from the adder 14a and an echo replica ECR2 from the submemory unit 22b are applied to an adder 14b, and an output from the adder 14b serves as the received data R(k).

The echo component corresponding to the tap number k of the main tap unit 21a is cancelled by the echo replica ECR1 from the main memory unit 22a, and the echo component corresponding to the tap number (n−k) of the subtap unit 21b is cancelled by the echo replica ECR2 from the submemory unit 22b. In this case, convergence processing is performed using an algorithm which minimizes the residual echo components ε1 and ε2, and the echo replicas ECR1 and ECR2 are respectively written in the main memory unit 22a and the submemory unit 22b.

As described above, when the number of taps of the main tap unit 22a is defined as k and the number of taps of the subtap unit 22b is defined as n−k, the capacity of the main memory unit 22a is proportional to $2^k$ and the capacity of the submemory unit 22b is proportional to $2^{n-k}$. Therefore, the total capacity is proportional to $2^k + 2^{n-k}$. Namely, the total capacity of the memory can be greatly reduced compared with the arrangement shown in FIG. 2, wherein the capacity of the memory unit 22 having n taps is proportional to $2^n$.

Nevertheless, although the memory division type arrangement can reduce the memory capacity as described above, this arrangement incurs a division loss, i.e., an accumulated error. More specifically, the echo components corresponding to the number n of all taps are not cancelled, and only the echo components corresponding to n and (n−k) divided taps are respectively cancelled. In the convergence mode, even when the echo replicas ECR1 and ECR2 corresponding to k and (n−k) of taps are very precisely written in the main memory unit 22a and the submemory unit 22b, respectively, if an error occurs in the echo replica ECR1, the residual echo component $\epsilon 1$ is increased, and further, if an error occurs in the echo replica ECR2, the residual echo component $\epsilon 2$ is increased. Therefore, the total echo component is the sum of the residual echo components $\epsilon 1$ and $\epsilon 2$, and the least significant bit (LSB) error cannot be avoided in the echo replicas ECR1 and ECR2, respectively. The total error in the echo replica is the sum of the errors in the echo replicas ECR1 and ECR2. Therefore, in the worst case when the number of divisions in the memory division type digital filter is increased, the amount of the total error may be proportionally increased.

Therefore, the first object of the present invention is to provide a method and apparatus for cancelling an echo component in a memory division type digital filter in which the memory capacity is reduced and the residual echo component is suppressed.

Figure 5:
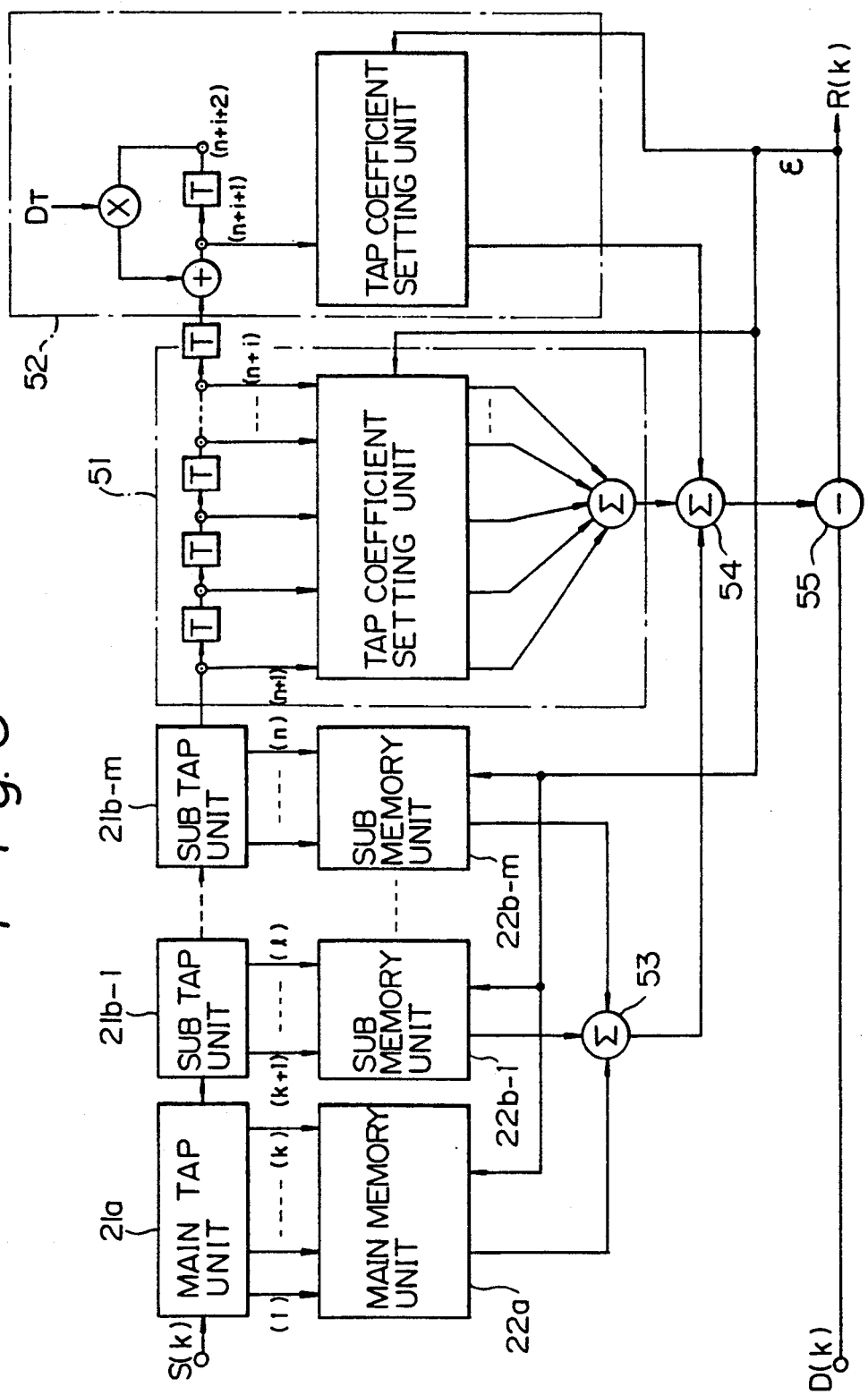
FIG. 5 is a block diagram showing a combination type echo canceller proposed prior to the present invention.

To cope with the problem in the circuit shown in FIGS. 2 and 3, another digital filter shown in FIG. 5 was proposed, prior to the present invention, to accurately cancel the echoes within a short converging time.

According to this arrangement, a look-up table memory is divided into a main memory unit 22a and a plurality of submemory units 22b-1 to 22b-m, and further, a transversal filter unit 51 and an IIR (infinite length impulse response) filter unit 52 are added. The main memory unit 22a generates the large amplitude level portion containing a peak level of a pseudo echo, the submemory units 22b-1 to 22b-m generate the relatively small echo levels following the large amplitude level portion of the pseudo echo, and the remaining portions are cancelled by the transversal filter unit 51 of "i" taps. In the last stage, the primary IIR filter portion 52 is disposed to cancel trailing echoes that monotonously attenuate. With this arrangement, echoes having long trails and containing non-linear components can be accurately cancelled within a short converging time.

Another object of the invention is to provide a convergent algorithm that can accurately carry out the initial convergence and adaptive control at a high speed in an adaptive type digital filter shown in FIG. 5.

Embodiments of the present invention now will be described with reference to FIGS. 6 to 14.

Figure 6:
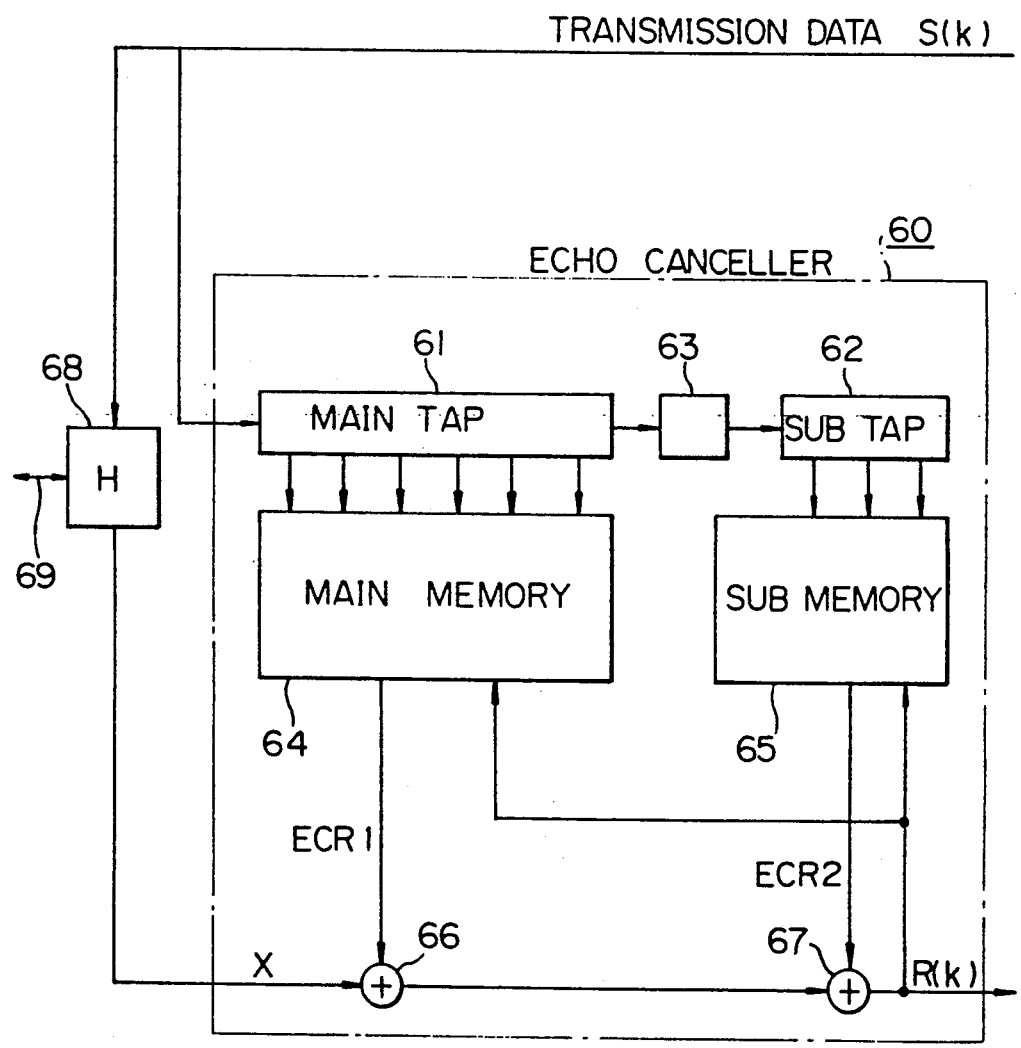
FIG. 6 is a block diagram of a memory division type according to an embodiment of the present invention.

FIG. 6 is a block diagram of a memory division type digital filter according to an embodiment of the present invention, wherein an echo canceler 60 functions as a digital adaptive filter for cancelling echo components. The block diagram in FIG. 6 per se is substantially the same as the conventional block diagram shown in FIG. 4.

The echo canceller 60 includes a main tap unit 61 (e.g. main tap group unit) for shifting transmitting data S(k) and for outputting same from a predetermined number of taps, a subtap unit 62 (e.g. subtap group unit), a 1-bit delay circuit 63 for delaying the output shifted from the main tap unit 61, a main memory unit 64 (e.g. main tap group) for storing echo replicas, a submemory unit (e.g. subtap group memory unit) 65, and two adders (e.g. adding means) 66 and 67. Note that the delay circuit 63 is, in actual, the final stage delay circuit in the main tap unit 61. Therefore, in FIG. 4, the delay circuit (e.g. hybrid unit) 63 is not explicitly shown.

The transmission data S(k) is transmitted through a hybrid circuit 68 to a transmission line 69, and further, is input to the main tap unit 61. The transmission data shifted in and serially output from the main tap unit 61 is then sent through the delay circuit 63 having a one bit delay to the subtap unit 62 wherein the data is shifted. The echo component X returned through the hybrid circuit 68 is applied to the adder 66, and through the adder 66 to the adder 67.

An echo replica ECR1 is read from the main memory unit 64 in accordance with an address signal from the main tap unit 61, and the read echo replica ECR1 is applied to the adder 66. An echo replica ECR2 is read from the submemory unit 65 in accordance with an address signal from the subtap unit 62, and the read echo replica ECR2 is applied to the adder 67.

The adder 66 adds the echo component X and the echo replica ECR1, and the adder 67 adds the added result and the echo replica ECR2. Accordingly, receiving data R(k) in which the echo component X is cancelled is output from the echo canceller 60.

In the submemory unit 65, the stored echo replica has a greater precision than the echo replica stored in the main memory unit 64, according to the present invention, and due to this greater precision, the influence of the echo replica read from the submemory unit 65 upon the residual echo contained in the receiving signal from the adder 66 can be decreased as later described. Therefore, not only can the total memory capacity be reduced by dividing the tap unit into the main tap unit and the subtap unit, and by dividing the memory into the main memory unit and the submemory unit, respectively, but also the error can be decreased by the greater precision of the echo replica stored in the submemory.

The greater precision of the echo replica is obtained by increasing the bit length of the echo replica ECR2 by, for example, one or two bits, in comparison with the bit length of the echo replica stored in the submemory unit in the conventional memory division type echo canceller. The increase of the bit length of the echo replica allows an increase of the memory capacity of the submemory, but since the memory capacity of the submemory is much smaller than the memory capacity of the main memory, the increase of the memory capacity due to the increase of the bit length of the echo replica stored in the submemory is negligible in comparison with the memory capacity of the main memory.

The precision of the echo replica will now be described by considering the errors in the memory divided into the main memory 64 and the submemory 65.

Assuming that the number of taps of the main tap unit 61 is n1, the maximum error in the echo replica ECR1 output from the main memory unit 64 is a1 (when the number of bits in the echo replica is m, the maximum error is $\frac{1}{2}^m$), the amount of real echo to be cancelled in the main memory unit 64 is EC1, and the residual echo after cancelling the echo component by the echo replica ECR1 is ε1.

Also, assuming that the number of taps of the subtap unit 65 is n2, the maximum error in the echo replica ECR2 output from the submemory 65 is a2, the amount of real echo to be cancelled in the submemory unit 65 is EC1, and the residual echo after cancelling the echo component by the echo replica ECR1 is ε1.

If the echo replica in the main memory unit 64 is correctly estimated, the following expression stands:

$$|EC1 + ECR1| = \epsilon 1 < a1 \tag{1}$$

Therefore, the residual echo, having a maximum of a1, is returned through the submemory unit 65 so that residual echo ε has the following relationship:

$$(-a1 + EC1) + ECR2 < \epsilon < (a1 + EC2) + ECR2 \tag{2}$$

By modifying the above expression, the following expression is obtained:

$$-a1 + (EC1 + ECR2) < \epsilon < a1 + (EC2 + ECR2) \tag{3}$$

Here, assuming that the echo replica in the submemory 65 is correctly estimated, then, $$|EC2 + ECR2| < a2 \tag{4}$$

is obtained, and from the expressions (3) and (4), the following relationship is obtained:

$$|\epsilon| < a1 + a2 \tag{5}$$

From the expression (5), it will be seen that the final residual echo ε may be, in the worst case, the sum of the maximum errors a1 and a2 of the echo replica ECR1 in the main memory unit 64 and the echo replica ECR2 in the submemory unit 65, respectively, even when the echo replicas which are to be written in these memory units are correctly estimated. Therefore, by dividing the memory into a plurality of submemories, the errors are accumulated.

In the conventional memory division type echo canceller, the maximum error a1 relating to the main memory unit 64 and the maximum error a2 relating to the submemory unit 65 are the same, and therefore, the expression (5) becomes:

$$\epsilon < 2a1 \tag{6}$$

Accordingly, in the conventional memory division type echo canceller, in the worst case, about 6 dB of the amount of the echo suppression is deteriorated by dividing the memory into the main memory and the submemory.

In the present invention, the accumulated error due to the memory division can be suppressed to a negligible amount by greatly reducing the maximum error a2 of the echo replica in the submemory unit 65, in comparison with the maximum error a1 of the echo replica in the main memory unit 64. Namely, when the maximum error a2 is negligible, a1 + a2 is nearly equal to a1. Therefore, the above expression (5) is modified as:

$$\epsilon < a1 \tag{7}$$

To reduce the maximum error a2 in the submemory, the memory capacity of the submemory unit 65 must be increased by, for example, one address bit, but since the submemory unit has a small capacity due to the memory division, this increase of the capacity does not seriously change the total memory capacity.

Note the maximum error a2 need not be negligible in comparison with the maximum error a1 of the echo replica in the main memory unit 64. Namely, even when the memory capacity of either the main memory unit 64 or the submemory unit 65 is increased, the sum of the maximum error (a1 + a2) is reduced. Further, when the memory capacities of both the main memory unit 64 and the submemory unit 65 are increased, the sum of the maximum error (a1 + a2) is also reduced.

An example is now described as follows.

Namely, when the maximum error a1 of the echo replica stored in the main memory unit 64 is $2^{-5}$, and when the maximum error of the echo replica stored in the submemory unit 65 is reduced to $2^{-6}$, the maximum residual echo ε is $(2^{-5} + 2^{-6})$ which is nearly equal to $2^{-5}$. In contrast, in the conventional memory division type echo canceller, the maximum error a1 of the echo replica stored in the main memory unit 64 is $2^{-5}$, and the maximum error of the echo replica stored in the submemory unit 65 is also $2^{-5}$. Therefore, the conventional maximum residual echo ε is $2 \times 2^{-5}$. Accordingly, the maximum residual echo in this example is about half of the maximum residual echo in the conventional echo canceller, and thus the amount of echo suppression can be improved by about 6 dB according to the embodiment of the present invention. Note that the maximum error $2^{-5}$ of the echo replica stored in the main memory unit 64 is determined by the number of bits of the echo replica stored in the same, and the maximum error $2^{-6}$ of the echo replica stored in the submemory unit 65 is determined by the number of bits of the echo replica stored in the same.

Next, an explanation is given of an example of an algorithm for writing echo replicas to the above-described main memory unit 64 and the submemory unit 65. It is assumed that the bit length of the echo replica stored in the main memory unit 64 is n and the bit length of the echo replica stored in the submemory unit 65 is m, where m is larger than or equal to (n + 1).

Figure 7:
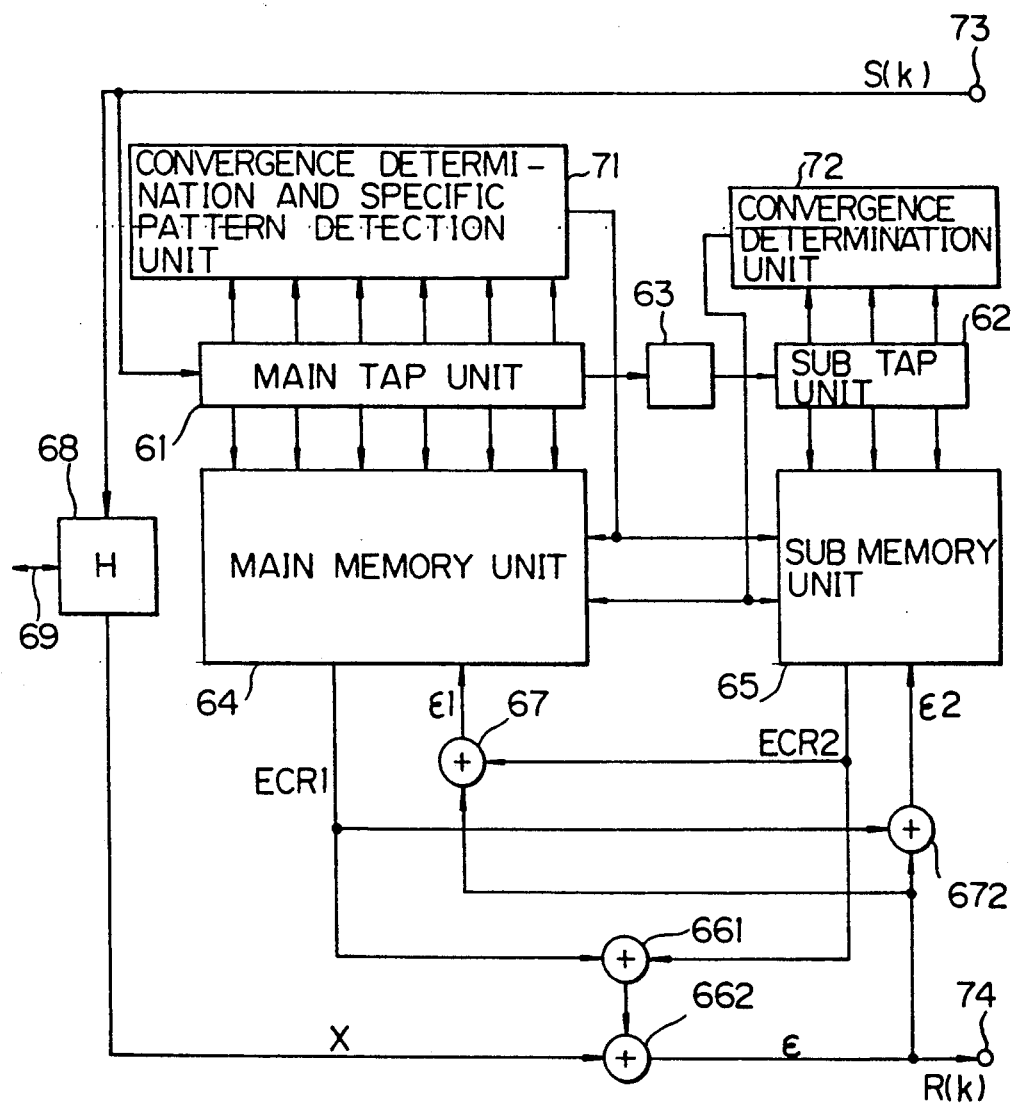
FIG. 7 is a detailed block diagram of the embodiment shown in FIG. 6.

FIG. 7 is a detailed block diagram of the echo canceller 60 shown in FIG. 6, wherein the same reference numbers represent the same parts in both figures.

In the figure, 71 is a convergence determination and specific pattern detection unit; 72 a convergence determination unit; 661, 662, 671 and 672 adders; 73 a terminal connected to a transmitter (not shown); and 74 a terminal connected to a receiver (not shown).

Transmission data S(k) is sent to the transmission line 69 through the hybrid circuit 68 and is supplied to the main tap unit 61. The transmission data S(k) is shifted by the main tap unit 61 and is further shifted by the subtap unit 62 through the one-bit delay circuit 63. An echo component X returning through the hybrid circuit 68 is supplied to the adder 661, and echo replicas ECR1 and ECR2 are read out from the main memory unit 64 and the submemory unit 65 in accordance with address signals from the main tap unit 61 and the subtap unit 62, respectively. The echo replicas ECR1 and ECR2 are added by the adder 661, and an output from the adder 661 is supplied to the adder 662, whereby received data R(k) from which the echo component X is cancelled is output from the terminal 24.

The echo component X can be cancelled by outputting the echo replica corresponding to the pattern of the transmission data S(k). The main tap unit 61, the subtap unit 62, the main memory unit 64, and the submemory unit 65 can be arranged by using random access memories. The functions of the convergence determination and specific pattern detection unit 71, the convergence determination unit 72, the adders 671 to 672, and the like can be realized by using the operation functions of a digital signal processor.

The convergence determination and specific pattern detection unit 71 detects whether or not an address signal supplied from the main tap unit 61 to the main memory unit 64 represents a specific pattern, to supply a detection signal to the main memory unit 64 and the submemory unit 65. The unit 71 also determines that the received signal is converged when the echo replicas corresponding to the number of taps of the main tap unit 61 are written, based on the address signals, at all addresses of the main memory unit 64. The unit 71 then outputs a determination signal to the main memory unit 64 and the submemory unit 65. The convergence determination unit 72 determines that the received signal is converged when echo replicas corresponding to the number of taps of the subtap unit 62 are written at all addresses of the submemory unit 14 based on the address signals supplied from the subtap unit 62 to the submemory unit 65. After the determination, the unit 72 outputs a determination signal to the main memory unit 64 and the submemory unit 65.

Convergence of the digital adaptive filter, i.e., the echo canceller shown in FIG. 7, is performed using the random pattern as the transmission data S(k), and therefore, signal patterns output from the taps of the main tap unit 64 and the subtap unit 65 become random. The echo components obtained when the convergence determination and specific pattern detection unit 71 detects the specific pattern output from the main tap unit 61, are averaged a predetermined number of times, e.g., several times or several tens of times as later described in more detail. The echo component X generated by returning through the hybrid circuit 68 in accordance with the specific pattern is applied to the main memory unit 64 through the adders 662 and 671, and an averaging calculation is performed in an arithmetic logic unit (not shown). The averaged value is written as an echo replica in the area of the main memory unit 64 accessed by the specific pattern address signal.

Upon completion of the writing, the echo replica written in the main memory unit 64 is subtracted from the echo component obtained when the convergence determination and specific pattern detection unit 71 detects the specific pattern, to obtain a replica, and this replica is written in the submemory unit 65 on the basis of the address signal from the subtap unit 62. In this case, the address signal input to the main memory unit 64 represents the specific pattern. Note, the address signal input to the submemory unit 65 represents a random pattern, and therefore, this operation is repeated a plurality of times to thereby write echo replicas at all of the addresses of the submemory unit 65. When the write access to all addresses is completed, the convergence of the submemory unit 65 is determined by the convergence determination unit 72, and a determination signal is output to the main memory unit 64 and the submemory unit 65.

Upon convergence in the submemory unit 65, the main memory unit 64 writes a given echo replica in the area thereof accessed by the address signal. The given echo replica is obtained by subtracting the echo replicas written in the submemory unit 65 from the echo components obtained when the address signal from the main tap unit 61 represents a pattern other than the specific pattern. When the convergence determination and specific pattern detection unit 71 determines that the echo replicas are written at all addresses of the main memory unit 64, the convergence is completed.

As described above, the echo replicas with respect to a specific pattern applied to the main tap unit 61 are averaged to obtain an averaged echo replica, and the averaged echo replica is written to the main memory unit 64, whereby an echo replica for a pattern to the subtap unit 65 is obtained. The echo replica written in the submemory unit 65 has a greater precision than the echo replica written in the main memory unit 64, due to an increase in the bit length of the echo replica in the submemory unit 65 by at least one bit. With respect to patterns other than the specific pattern in the main tap unit 64, an echo replica is obtained by subtracting the echo replica ECR2 from an echo component X.

Accordingly, as described above, echo replicas are written to the main memory unit 64 and the submemory unit 65 in accordance with a predetermined algorithm, and at this time, the precision of the echo replica written to the submemory unit 65 is greater than the precision of the echo replica written to the main memory unit 64, due to an increase of the data bit length of the echo replica written to the submemory unit 65, whereby the increase of the maximum error due to the memory division can be suppressed so that both the reduction of the memory capacity by the memory division and the reduction of the residual error, compared with the case of a simple memory division without correcting the precision of the echo replica, can be obtained.

The above-described embodiment includes the single main memory unit 64 and the single submemory unit 65, but the present invention is not restricted to this embodiment. Namely, the memory may be divided into a single main memory unit and a plurality of submemory units. In this case, the precision of each of the echo replicas written to the plurality of submemory units must be made greater than the precision of the echo replica written to the main memory unit.

FIG. 8 is a flow chart for explaining a converging operation in the echo canceller shown in FIG. 7, according to the embodiment of the present invention. As previously described, the transmission data S(k) represents a random pattern, and in step 1, the convergence determination and specific pattern detection unit 71 determines whether or not an address signal applied from the main tap unit 61 to the main memory unit 64 represents a specific pattern.

When a random pattern during convergence is used as the transmission data S(k), a synchronization word (hereinafter referred to as sync word), for example, 9 symbols, is inserted in every 120 symbols to perform a frame synchronization in the same manner as in the normal transmission data. Therefore, the sync word may be used as the previously-mentioned specific pattern.

When the number of taps of the main tap unit 64 is equal to the number of bits of the sync word, the convergence determination and sync pattern detection unit 71 can accurately detect the sync word as a specific pattern. It is also possible to use a number of taps smaller than the number of bits of the sync word. A data pattern applied prior to the specific pattern is output from the taps of the subtap unit 62, and the specific pattern such as a sync word is inserted at a period different from that of the random pattern. Therefore, when the specific pattern is output from the main tap unit 64, the random pattern is output from the subtap unit 65.

Since all the initial storage contents of the main memory unit 64 and the submemory unit 65 are zero, the echo component X returned from the hybrid circuit 68 and applied to the adder 662 is output as a residual echo component ε without change. The residual echo component ε obtained when the specific pattern is output from the main tap unit 61 is applied as an echo component to the main memory unit 64 through the adder 671. The echo components obtained upon every detection of the specific pattern are averaged a predetermined number of times in step 2. In this case, it is possible to use a sine algorithm, or this averaging calculation can be performed by using operation functions in the main memory unit 64 or other operation functions. The averaged echo component as a first echo replica for the specific pattern is written in the area of the main memory unit 64 accessed by the specific pattern address signal.

Upon completion of the above processing, when the convergence determination and specific pattern detection unit 71 again detects a specific pattern in the main tap unit 64, the first echo replica ECR1 is read out from the main memory unit 64. In step 3, the adder 672 calculates a residual echo component $\epsilon 2 = X - ECR1$.

When the specific pattern is detected by the main tap unit 61, a random pattern is output from the subtap unit 62, and by using this random pattern as an address signal, the residual echo component ε2 is written in the submemory unit 65 as a second echo replica in step 4.

The convergence determination unit 72 determines in step 5 whether or not a write operation of the first echo replicas at all addresses of the submemory unit 65 is completed. Similarly, the convergence determination and specific pattern detection unit 71 determines in step 6 whether or not a write operation at all addresses of the main memory unit 64 is completed. When this determination is made, the convergence processing is completed.

When the specific pattern is not output from the main tap unit 61, it is determined in step 7 whether or not a write operation of the second echo replicas at corresponding addresses of the submemory unit 65 is completed. This determination can be performed by the convergence determination unit 72. For example, when a write operation to all addresses of the submemory unit 65 is completed, the completion of the write operation is determined in step 7.

When the write operation at t corresponding addresses is completed, the echo replica ECR2 from the submemory unit 65 is subtracted from the echo component X by the adder 671 to calculate the residual echo component ε1. As the first echo replica corresponding to the pattern of the main tap portion 61, the residual echo component ε1 is written in the area of the main memory unit 64 accessed by the address signal from the main tap unit 61 in step 8.

As described before, after the first echo replica corresponding to the specific pattern of the main tap unit 61 is obtained, the second echo replica for the pattern of the subtap unit 62 is obtained. For patterns other than the specific pattern of the main tap unit 61, the echo replica ECR2 from the submemory unit 65 is subtracted from the echo component X to obtain an echo replica, and even if the number of taps is large, accurate echo replicas can be set.

The echo replicas corresponding to various patterns of the transmission data S(k) can be stored in the main memory unit 64 and the submemory unit 65 by the above convergence process. At the time of data transmission, the echo replicas ECR1 and ECR2 corresponding to a given pattern of the transmission data S(k) are respectively read out from the main memory unit 64 and the submemory unit 65 and are added by the adder 661, and a sum output from the adder 661 becomes an echo replica corresponding to the pattern of the transmission data S(k) at this time and is input to the adder 662. Therefore, received data R(k) from which the echo component X is cancelled can be output from the terminal 24.

When the submemory unit 65 is further divided into first and second submemory units, (1) an echo replica for the specific pattern is first written in the main memory unit 64, and (2) an echo replica generated by a residual echo component obtained when address signals for the main memory unit 64 and the first submemory unit represent specific patterns is written in the second submemory unit, and when the write operation at all addresses of the second submemory unit is completed, (3) the echo replica from the second submemory unit and the specific pattern echo replica from the main memory unit are added to each other, and an echo replica obtained by adding the added result and the echo component X is written in the first submemory unit. When the write operation at all addresses of the first submemory unit is completed, (4) for patterns other than the specific pattern, an echo replica obtained by subtracting the echo replicas from the first and second submemory units from the echo components is written in the main memory unit 64. Similarly, the above can be applied to a case wherein the submemory unit is divided into a large number of submemory units.

When a bidirectional data transmission is performed after completion of the above-described converging processing, the echo replicas in the main memory unit 64 and the submemory unit 65 can be adaptively updated.

Figure 9:
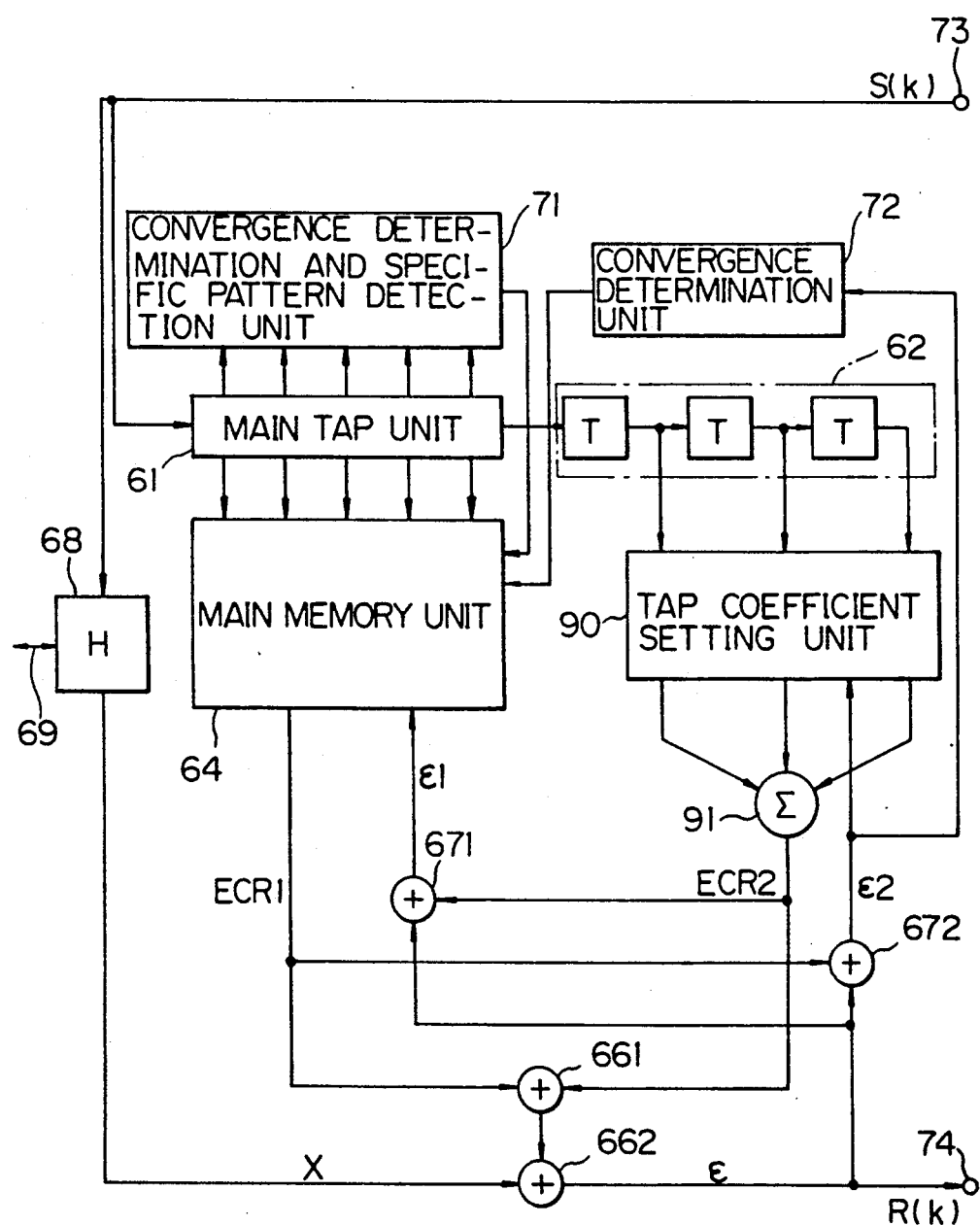
FIG. 9 is a block diagram showing a combination type echo canceller according to still another embodiment of the present invention.

FIG. 9 is a block diagram showing another embodiment of the present invention. In this embodiment, a subunit comprises a transversal filter instead of the submemory unit. Referring to FIG. 9, 90 represents a tap coefficient setting unit, and 91 represents an adder. The other portions are the same as those in FIG. 7.

The subunit of a transversal filter arrangement is constituted by the tap coefficient setting unit 90 and the adder 91. Transmission data S(k) is output to the transmission line 69 through the hybrid circuit 68 and is supplied to and shifted by the main tap unit 61. The transmission data S(k) is supplied to and further shifted by the subtap unit 62, which includes one-bit delay circuits T, respectively. The convergence determination unit 72 determines a convergence of the setting of the tap coefficients in the tap coefficient setting unit 90 formed by a transversal filter when a residual echo component ε2 applied to the tap coefficient setting unit 90 falls within a predetermined range.

A write operation of echo replicas in the main memory unit 64 during convergence is substantially the same as in the previous embodiment shown in FIG. 7. The tap coefficient is set by the tap coefficient setting unit 90 based on a residual echo component obtained upon detection of the specific pattern from the main tap unit 61.

FIG. 10 is a flow chart explaining the convergence process in the embodiment shown in FIG. 9. Upon starting the convergence processing in the same manner as in the previous embodiment, transmission data S(k) having a random pattern is supplied to the terminal 73. In the same manner as in step 1, the convergence determination and specific pattern detection unit 71 detects in step 11 whether or not a specific pattern such as a sync word is output from the main tap unit 61.

The echo component obtained when the specific pattern such as a sync word is output from the main tap unit 61 is held, and the echo components are averaged a predetermined number of times as in step 2 (step 12). When the averaging processing is completed, the average echo component is written as a specific pattern echo replica for the transmission data in the area of the main memory unit 64 accessed by the specific pattern address signal.

When the convergence determination and specific pattern detection unit 71 detects that the main tap unit 61 has again output a specific pattern, an echo replica ECR1 read out from the main memory unit 64 is subtracted from the corresponding echo component X by the adder 672 in the same manner as in step 3 to calculate a residual echo component $\epsilon 2$ ($\epsilon 2 = X - ECR1$) (step 13). Tap coefficients of the tap coefficient setting unit 90 are set in accordance with a known algorithm using the residual echo component $\epsilon 2$ (step 14).

It is then determined in step 15 whether the specific pattern is output from the main tap unit 61 a predetermined number of times. That is, it is determined whether or not the tap coefficients of the tap coefficient setting unit 90 are repeated the predetermined number of times. If the tap coefficients are repeatedly set a predetermined number of times, it is then determined in step 16 whether or not the write operation at all addresses of the main memory unit 64 is completed in the same manner as in step 16. If the write operation at addresses is completed, the convergence processing is completed.

When an address signal except for the specific pattern address signal is supplied from the main tap unit 61 to the main memory unit 64, it is determined in step 17 whether or not the specific pattern appears a predetermined number of times, as in step 15. In other words, the subunit of the transversal filter arrangement repeatedly sets the tap coefficients a predetermined number of times, and the convergence processing of the subunit is determined.

An output echo replica from the adder 91, i.e., an echo replica from the transversal filter arrangement (TF unit) is subtracted by the adder 671 from the echo component for the pattern except for the specific pattern to obtain a residual echo component $\epsilon 1$ ($= X - ECR2$) (step 18). The residual echo component $\epsilon 1$ is written in the main memory unit 64 as an echo replica for the corresponding pattern from the main tap unit 61 in step 19. When the write operation of echo replicas at all addresses of the main memory unit 64 is completed, the convergence processing is completed.

In this embodiment, for the echo components divided in correspondence with the numbers of taps of the main tap unit 61 and the subtap unit 62, echo components corresponding to the taps of the subtap unit 62 are linear in correspondence with the foot portions of an impulse response. The echo components corresponding to the taps of the main tap units 61 vary depending on the patterns of the transmission data S(k). In this case, the echo replicas corresponding to the patterns can be accurately stored in the main memory unit 64. The echo replica ECR1 read out from the main memory unit 64 and the echo replica ECR2 output from the adder 91 are added by the adder 661 at the time of data transmission. An echo replica (ECR1+ECR2) corresponding to the corresponding pattern of the transmission data is supplied to the adder 662, to thereby cancel the echo component X.

At the time of a bidirectional data transmission after the convergence processing, the echo replicas of the main memory unit 64 and the tap coefficients of the tap coefficient setting unit 90 can be adaptively updated.

According to the embodiments of the present invention as described above with reference to FIGS. 7 to 10, the tap unit for shifting the transmission data and outputting the parallel data is divided into the main tap unit 61 and an arbitrary number of subtap units. The parallel signal output from the main tap unit 61 is supplied to the main memory unit 64 as the address signal, and the parallel signals output from the subtap units are supplied to the respective subunits. When the subunits have a memory arrangement, the digital adaptive filter corresponds to a memory division type filter, thereby greatly reducing the memory capacity.

The echo components obtained when the specific patterns such as sync words are output from the main tap unit 61 are averaged a predetermined number of times, and the averaged value is written in the main memory unit 64 accessed by the specific pattern address data, to thereby obtain a very precise echo replica for the specific pattern.

The residual echo component obtained by subtracting the echo replica of the main memory unit 64 from the echo component obtained upon detection of the specific pattern is written or tap coefficients are set for the subunits. The subunits can be accurately set and controlled on the basis of the very precise echo replicas. The echo replicas obtained from the subunits can be made very precise, and the division loss does not occur.

For the patterns other than the specific pattern, the echo replicas are written in the main memory unit 64 based on the residual echoes obtained by subtracting the echo replicas of the already converged subunits from the echo components, and therefore, very precise echo replicas can be written in the main memory unit 64. At the same time, even if the number of taps is large, the time required for fetch processing can be shortened.

Figure 11:
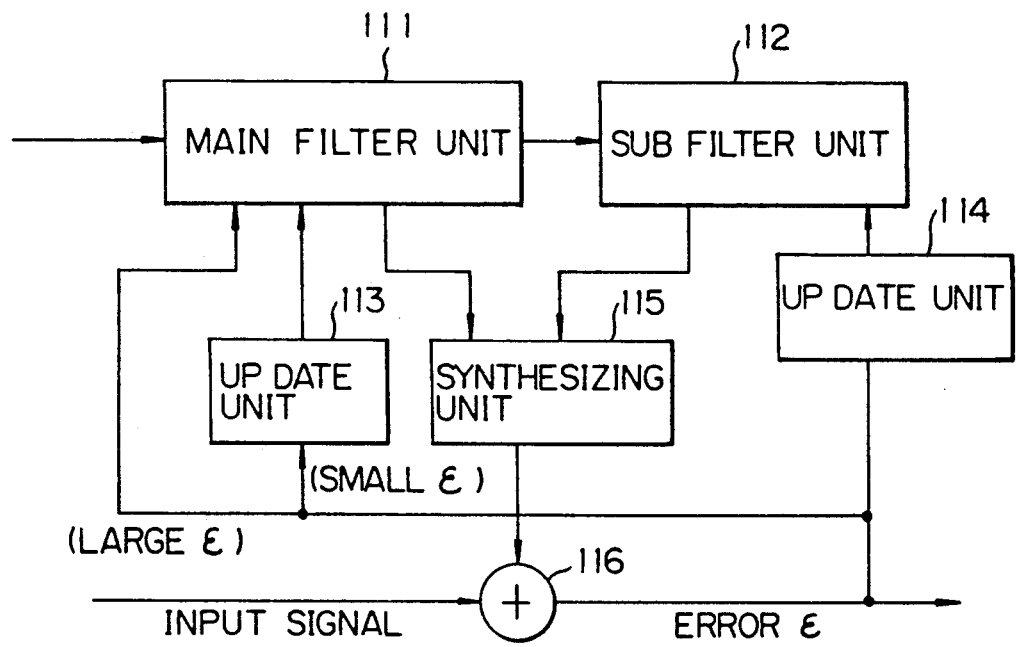
FIG. 11 is a block diagram showing an adaptive type echo canceller according to still another embodiment of the present invention.

FIG. 11 is a block diagram showing a principle constitution of an adaptive digital filter according to still another embodiment of the present invention.

In FIG. 11, the adaptive digital filter includes a lookup table type main filter unit 111 for generating main components of a pseudo signal, a subfilter unit 72 for generating secondary components of the pseudo signal, and a synthesizing portion 115 for synthesizing the pseudo signal from the main components and secondary components. The main filter unit 111 and a part of the subfilter unit 112 are substantially the same as the main memory unit 64 and the submemory unit 65, respectively, in the first embodiment shown in FIG. 6. If the error is large, the content of the main filter unit 111 is updated by an update unit 113 according to a calculation directly based on an error between an input signal and the pseudo signal, and if the error is small, the main filter unit 111 is updated depending on the polarity of the error and according to a predetermined step size that is smaller than "1." The secondary filter unit 112 is updated depending on the polarity of the error according to a predetermined step size that is smaller than "1."

Figure 12:
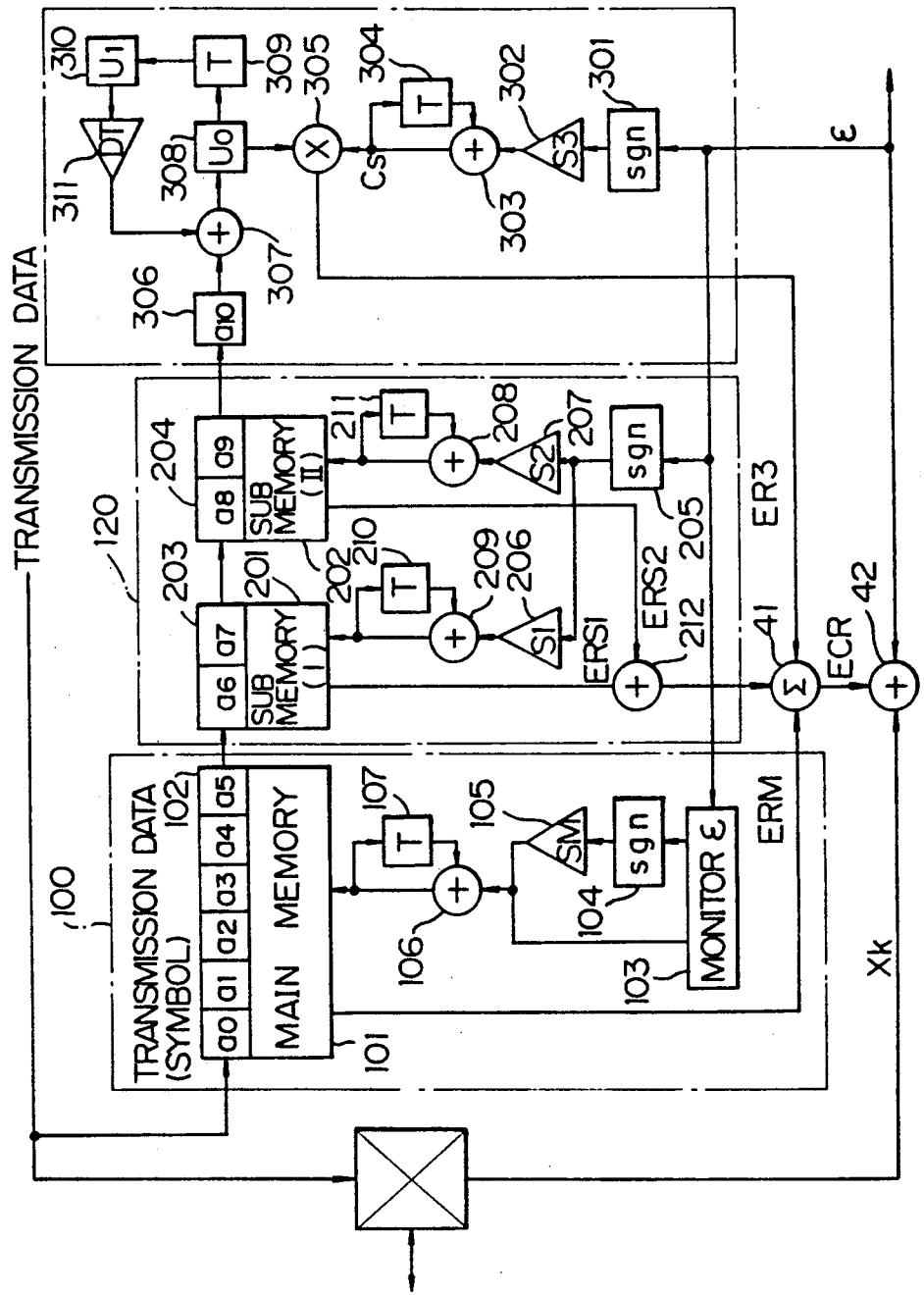
FIG. 12 is a block detailed diagram of the embodiment shown in FIG. 11.
Figure 13B:
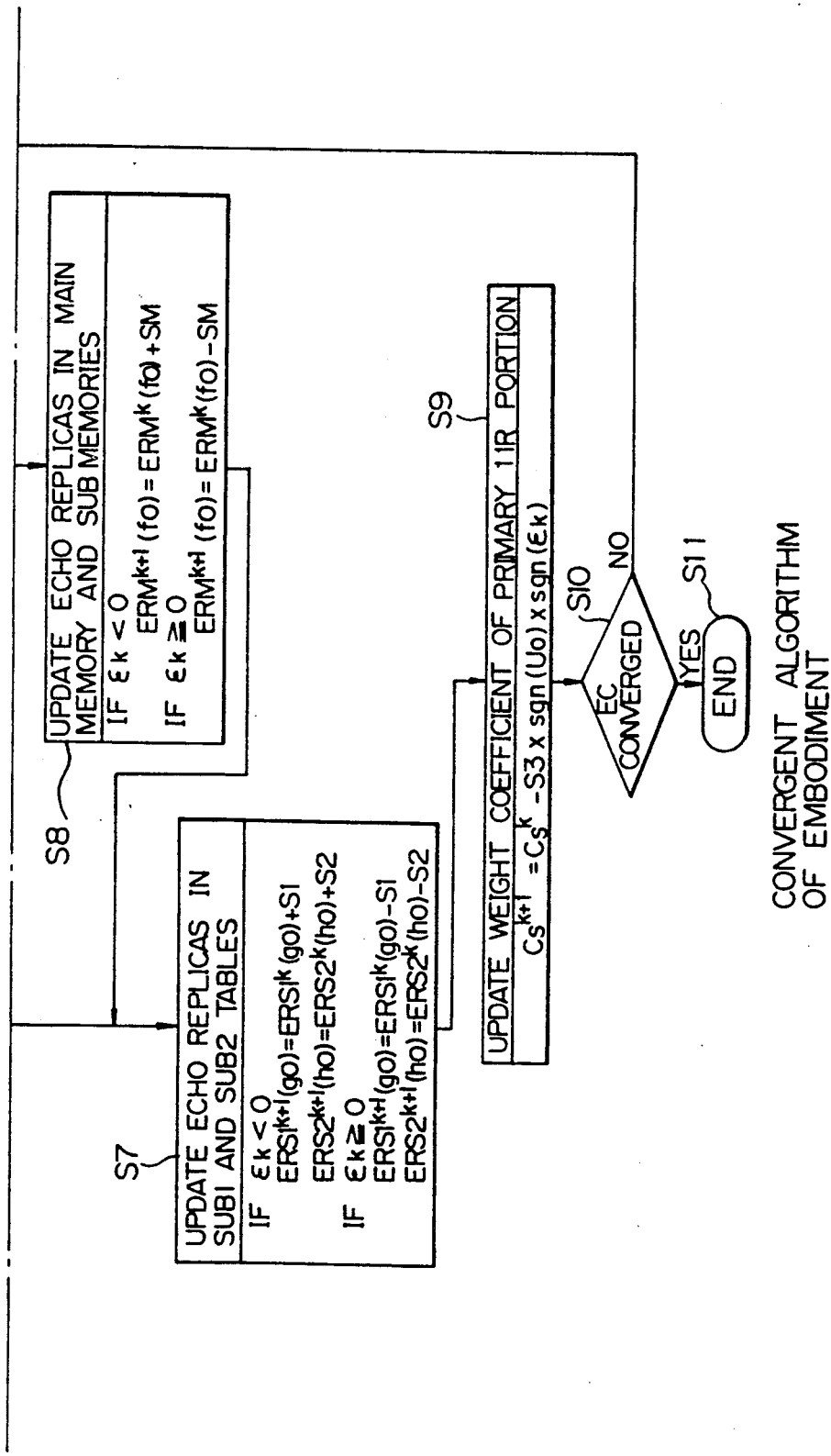

A method of converging an adaptive digital filter according to this embodiment of the invention will be explained in more detail with reference to FIGS. 12 and 13. The adaptive digital filter is applied to an echo canceller and realized by a DSP (digital signal processor). FIG. 12 is a block diagram showing respective functions realized by the DSP.

In FIG. 12, 100 is a main table portion, 120 a subtable portion, 130 is an IIR filter portion, 41 and 42 adders, and 43 a 2-wire/4-wire converting portion (hybrid circuit). The main table portion 100 and the submemory table portion 120 form a table division type table lookup echo canceller. The main table portion 100 includes a main memory unit 101, a tap unit 102 having six taps, a residual error monitoring portion 103, a sign detecting portion 104, a step size deciding portion 105, an adding portion 106, and a delay portion 107. The secondary table portion 120 is composed of two submemory units each having two taps. The secondary table portion 120 includes submemory units 201 and 202, tap portions 203 and 204, a sign detecting portion 205, step size deciding portions 206 and 207, adding portions 208, 209 and 212, and delay portions 210 and 211. The IIR filter portion 130 includes a sign detecting portion 301, a step size deciding portion 302, adding portions 303 and 307, delay portions 304 and 309, a multiply portion 305, registers 306, 308 and 310, and an attenuation coefficient portion 311, etc.

Similar to the embodiment shown in FIG. 7, the precision of the echo replica written in the submemory unit 201 or 202 is greater than the precision of the echo replica in the main memory 101.

As transmission codes of transmission data, 4-value 2B1Q codes are employed. Since the 2B1Q codes have direct current components, low-frequency cutting circuits, such as transformers, may generate returning echoes each having a very long trailing portion that monotonously attenuates. To equalize or cancelling the trailing portion, the primary IIR filter portion 130 is disposed after the memory division type echo canceller.

The operation of the embodiment shown in FIG. 12 will be explained with reference to FIG. 13, which is a flowchart showing a convergent algorithm of the echo canceller of the embodiment.

First, initial values are set (Step S2). Namely, the contents of the main memory unit 101, submemory units 201 and 202, registers 308 and 310, etc., are cleared and set to "0."

Then, addresses of the respective memory units corresponding to a transmission signal are calculated (Step S3). Here, ERM($f_0$) is an echo replica read out of the main memory unit 101 at an address $f_0$, ERS1($g_0$) an echo replica read out of the submemory unit 201 at an address $g_0$, ERS2($h_0$) an echo replica read out of the submemory unit 202 at an address $h_0$, and ER3 an echo replica output from the primary IIR filter portion 130. The echo replica ER3 is calculated as follows:

$$U_0 = D_r \times U_1 + a_{10}$$

$$ER3 = C_s^k \times U_0.$$

Wherein $D_r$ is an attenuation coefficient of the primary IIR filter portion 130, $C_s$ is a weight coefficient of the primary IIR filter portion 130, and $a_0$ to $a_{10}$ are transmission symbols.

Then, a residual error $\epsilon$ is operated as follows (Step S4):

$$\epsilon_k = X_k + ERM^k(f_0) + ERS1^k(g_0) + ERS2^k(h_0) + ER3.$$

Wherein $X_k$ is an input, i.e., a returning echo.

It is then determined whether or not the operated residual error $\epsilon_k$ satisfies $|\epsilon_k| \geq y$ (Step S5), by the $\epsilon$ monitoring portion 103. Here, "y" is a positive numeral smaller than 1.

If the expression $|\epsilon_k| \geq y$ is satisfied, i.e., if the residual error $\epsilon_k$ is large, the echo replica ERM of the main table memory is updated as follows (Step S6):

$$ERM^{k+1}(f_0) = ERM^k(f_0) + \epsilon_k$$

Namely, the already stored echo replica $ERM^k(f_0)$ is read out of the main memory unit 101 at the address $f_0$ and added to the residual error $\epsilon_k$, and a result of the addition is set as the echo replica updated value $ERM^{k+1}(f_0)$ and again stored in the main memory unit 101. These processes are carried out in the adding portion 106 and delay portion 107, etc.

Echo replicas of the submemory units 201 and 202 are updated as follows, depending on the polarity of the residual error $\epsilon_k$ (Step S7).

When $\epsilon_k < 0$,
$ERS1^{k+1}(g_0) = ERS1^k(g_0) + S1$
$ERS2^{k+1}(h_0) = ERS2^k(h_0) + S2.$
When $\epsilon_k \geq 0$,
$ERS1^{k+1}(g_0) = ERS1^k(g_0) - S1$
$ERS2^{k+1}(h_0) = ERS2^k(h_0) - S2.$ Here, S1 and S2 are step sizes that are positive numerals and smaller than 1 (0 < SM, S1, S2, S3 . . . << 1). The polarity of the residual error $\epsilon_k$ is detected by the sign detecting portion 205, and if the sign is negative, the echo replica $ERS1^k(g_0)$ is read out of the submemory unit 201 at the address $g_0$ and added to the very small step size S1 to obtain the echo replica updated value $ERS1^{k+1}(g_0)$, which is again stored in the submemory unit 201. On the other hand, if the residual error $\epsilon_k$ is positive, the step size S1 is subtracted. Accordingly, the echo replica in the submemory unit 201 is gradually converged. Similarly, the echo replica ERS2 of the submemory unit 202 is updated stepwise. These processes are carried out in the sign detecting portion 205, step size deciding portions 206 and 207, adding portions 208 and 209, and delay portions 210 and 211, etc.

On the other hand, if the expression $|\epsilon_k| < y$ is satisfied, i.e., if the residual error $\epsilon_k$ is sufficiently small, the echo replica of the main table memory 101 is updated as follows (Step S8).

When $\epsilon_k < 0$,
$ERM^{k+1}(f_0) = ERM^k(f_0) + SM.$
When $\epsilon_k \geq 0$,
$ERM^{k+1}(f_0) = ERM^k(f_0) - SM.$ These are the same as those of the stepwise update of the submemory units 201 and 202, and by adding or subtracting the step size SM, the echo replica is updated. For the submemory units 201 and 202, the same process as Step S7 is carried out to update the echo replicas stepwise.

Then, the weight coefficient $C_s$ of the primary IIR filter portion 130 is updated according to the following expression:

$$C_s^{k+1} = C_s^k - S3 \times sgn(U_0) \times sgn(\epsilon_k).$$

Namely, the attenuation coefficient $D_r$ of the primary IIR filter portion 130 is fixed, and only the polarity of the residual error $\epsilon_k$ is monitored. The weight coefficient $C_s$ is sequentially updated stepwise according to a sign algorithm based on the minute step size S3 ($0 < S3 < < 1$).

The above-mentioned processes are repeated until the echo input signal in the canceller has properly converged (Step S10).

Figure 14:
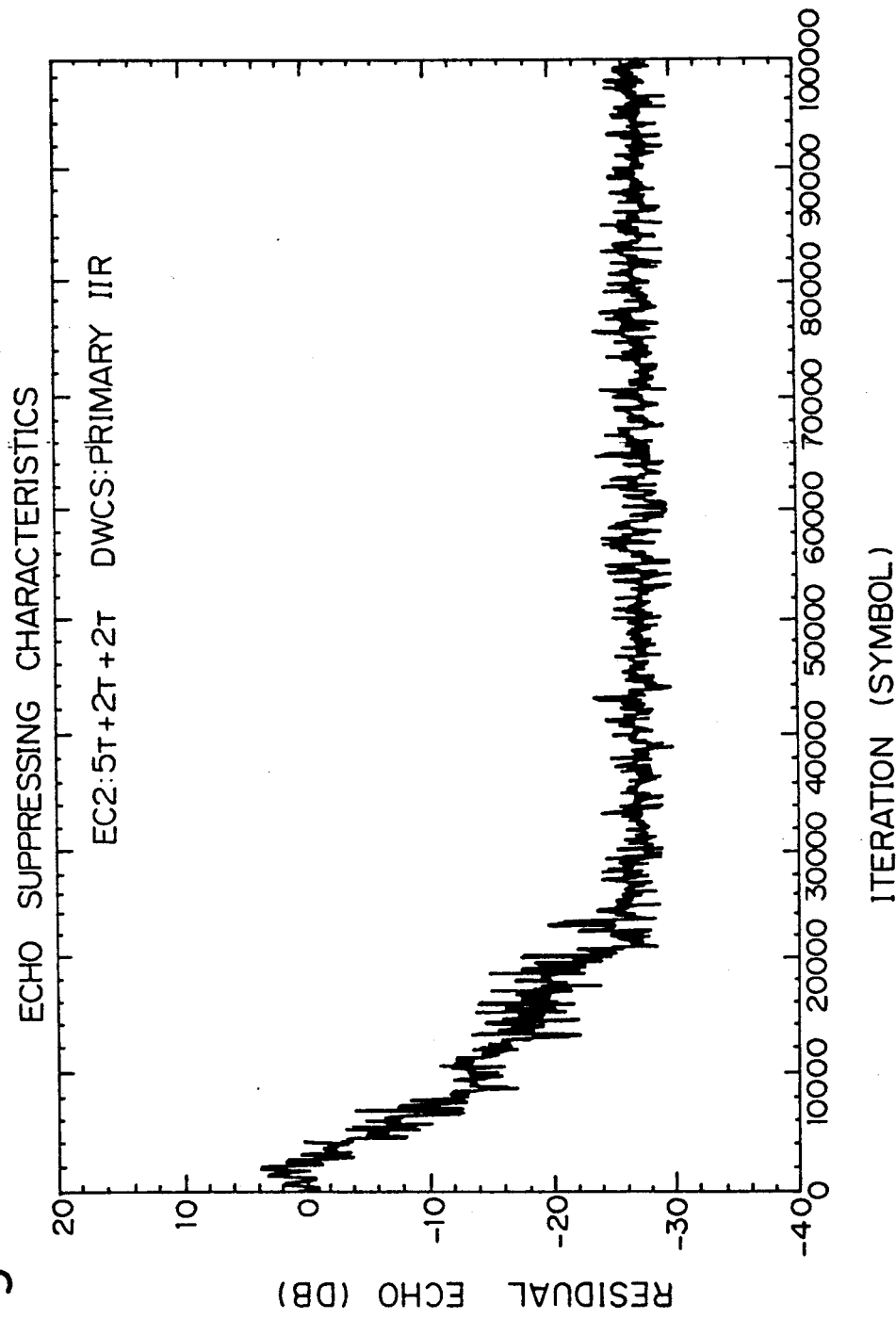
FIG. 14 is a graph showing an echo suppressing characteristic obtained by a computer simulation.

FIG. 14 shows a result of computer simulation of echo suppressing characteristics of the echo canceller based on the above-mentioned convergent algorithm employing the 2B1Q codes. In FIG. 14, the ordinate indicates residual echoes and the abscissa represents iteration (number of repetitions). Since the embodiment quantizes the input value $X_k$ with five decimal bits, a logical maximum echo suppression quantity is $-30$ dB. As a result of the simulation, the echo suppression quantity is about $-26$ dB, i.e., an ideal echo suppression has been achieved.

Various modifications of the embodiments of the invention are possible. Namely, although the embodiment is composed of the filter portion of a main memory unit, which is followed by the submemory units and IIR filter, this arrangement is not intended to limit the invention. For example, the invention may be realized with a main memory unit and submemory units; with a main memory unit, submemory units and a transversal filter; with a main memory unit and a transversal filter; with a main memory unit, a transversal filter and an IIR filter; or with a main memory unit and an IIR filter.

Also although the embodiment has employed the sign algorithm for executing the stepwise updating, a stochastic iteration algorithm, or an adaptive step sign algorithm, etc., may be employed.

Further, although the embodiment has changed the updating methods of the main memory unit from one to another by comparing the residual error $\epsilon$ with the predetermined value "y," it may automatically be changed from one to another based on a timer after a time within which the residual error $\epsilon$ becomes sufficiently small.

Moreover, although the embodiment has applied the adaptive digital filter of the invention for the echo canceller, the adaptive digital filter of the invention is generally applicable for apparatuses such as waveform generators and equalizers generating optional waveforms.

From the foregoing description, it will be apparent that, according to the invention, an adaptive digital filter is obtained which can accurately converge the input signal at a high speed, and in which a residual error due to memory division is reduced.

We claim:

1. A digital adaptive filter for cancelling an echo component generated by a partial return of a transmission signal, comprising:
    main tap group means for sequentially shifting the transmission signal and outputting the shifted signal in parallel;
    at least one subtap group means, operatively connected to said main tap group means, for sequentially shifting the transmission signal and outputting the shifted signal in parallel;
    main tap group memory means, operatively connected to said main tap group means, for storing a first echo replica which can be stored or read by using the parallel signal from said main tap group means as an address signal;
    at least one subtap group memory means, operatively connected to said at least one subtap group means, for storing a second echo replica which can be stored or read by using the parallel signal from said at least one subtap group means as an address signal and which has a greater precision than the first echo replica stored in said main memory means;
    adding means, operatively connected to said main tap group memory means and said at least one subtap group memory means, for adding the first echo replica read from said main tap group memory means and the second echo replica read from said at least one subtap group memory means.

2. A digital adaptive filter as claimed in claim 1, wherein the first echo replica has a bit length and wherein
    the second echo replica stored in said at least one subtap group memory means has a longer bit length than the bit length of the first echo replica stored in said main tap group memory means.

3. A digital adaptive filter as claimed in claim 2, wherein said at least one subtap group memory means has a first memory capacity, and wherein
    said main tap group memory means has a second memory capacity and wherein
    the first memory capacity is smaller than the second memory capacity so that an increase of the first memory capacity due to the increase of the bit length of the second echo replica stored in said at least one subtap group memory means is negligible in comparison with the first memory capacity before division.

4. A digital adaptive filter as claimed in claim 1, wherein said main tap group means has a first number of taps and said at least one subtap group means has a second number of taps, and wherein
    the number of first taps is larger than the second number of taps.

5. A digital adaptive filter as claimed in claim 1, further comprising:
    a transmitter;
    a receiver;
    hybrid means operatively connected to said transmitter and said receiver, for effecting a two-wire, four-wire conversion.

6. A digital adaptive filter as claimed in claim 1, wherein said main tap group means includes means for providing an address signal, and wherein the digital adaptive filter further comprises:
    convergence determination and specific pattern detection means, operatively connected to said main tap group means, for detecting whether or not the address signal represents a specific pattern, and for determining whether the transmission signal is converged when the second echo replica is written at all addresses of said main tap group memory means.

7. A digital adaptive filter as claimed in claim 6, further comprising:
    convergence determining means, operatively connected to said at least one subtap group means, for determining whether the transmission signal is written at all addresses of said at least one subtap group memory means.

8. A digital adaptive filter as claimed in claim 6, wherein said main tap group memory means includes means for outputting echo components, and and said main tap group means includes means for providing first address signals, and wherein the digital adaptive filter further comprises:

echo components averaging means, operatively connected to said main tap group memory means, for averaging the echo components when the first address signals represent the specific pattern, and for writing the averaged value as the first echo replica in said main tap group memory means.

9. A digital adaptive filter as claimed in claim 1, wherein said digital adaptive filter includes a receiving line, and wherein said adding means comprises:

first adder means, operatively connected to said main tap group memory means and the receiving line, for adding the echo component returned through the receiving line with the first echo replica read from said main tap group memory means and for providing a first output signal based on the adding; and second adder means, operatively connected to said first adder means, for adding the first output signal and the second echo replica read from said at least one subtap group memory means for providing a second output based on the adding and for cancelling the echo component based on the second output.

10. A digital adaptive filter as claimed in claim 1, wherein said adding means comprises:

first adder means, operatively connected to said main tap group memory means, for adding the first echo replica read from said main tap group memory means and the second echo replica read from said at least one subtap group memory means and for providing a first output signal based on the adding;

second adder means, operatively connected to said first adder means, for adding the echo component and the first output signal, for providing a second output signal based on the adding and for cancelling the echo component based on the second output signal.

11. A digital adaptive filter as claimed in claim 1, wherein said second output signal has a residual error and said at least one subtap group memory means includes means for outputting a third output signal, and wherein said adding means further comprises:

third adder means, for adding the residual error and the third output signal and for providing a residual echo component based on the adding; and fourth adder means for adding the residual echo component and the first echo replica output and for providing a second residual echo component.

12. A digital adaptive filter for cancelling an echo component generated by a partial return of a transmission signal to a receiving side, characterized by comprising:

a tap unit for sequentially shifting the transmission signal and outputting the shifted signal in parallel, said tap unit being divided into a main tap unit and at least one subtap unit;

a main memory unit, operatively connected to said main tap unit, for storing an echo replica which can be stored or read by using the parallel signal from said main tap unit as an address signal;

at least one transversal filter, operatively connected to said at least one subtap unit, for setting tap coefficients based on a residual echo component obtained upon detection of a specific pattern from said main tap unit; and adding means, operatively connected to said main memory unit and said at least one transversal filter for adding the echo replica read from said main memory unit and the output signal from said at least one transversal filter;

the output signal of said at least one transversal filter having a greater precision than the precision of the echo replica stored in said main memory unit.

13. A digital adaptive filter as claimed in claim 12, wherein the number of taps of said main tap unit is larger than the number of taps of said at least one subtap unit.

14. A digital adaptive filter as claimed in claim 12, further comprising:

a transmitter;

a receiver;

a hybrid means operatively connected to said transmitter and said receiver, for effecting a two-wire, four-wire conversion.

15. A digital adaptive filter as claimed in claim 12, wherein said main tap unit includes means for providing an address signal, and wherein the digital adaptive filter further comprises:

convergence determination and specific pattern detection means, operatively connected to said main tap unit, for detecting whether or not the address signal represents a specific pattern, and for determining whether the transmission signal is converged when the second echo replica is written at all addresses of said main memory unit.

16. A digital adaptive filter as claimed in claim 15, wherein said at least one transversal filter includes tap coefficients and wherein said digital adaptive filter further comprises:

convergence determining means, operatively connected to said at least one subtap unit, for determining convergence of the setting of the tap coefficients when the residual echo component applied to said at least one transversal filter falls within a predetermined range.

17. A digital adaptive filter as claimed in claim 15, wherein said main memory unit includes means for outputting echo components based on the echo replica, and wherein said digital adaptive filter further comprises:

echo components averaging means, operatively connected to said main memory unit, for averaging the echo components when the address signals from said main tap unit represent the specific pattern for providing an averaged value based on the averaging and for writing the average value as the first echo replica in said main memory unit.

18. A digital adaptive filter as claimed in claim 12, wherein said at least one transversal filter includes means for providing a first output signal and wherein said adding means comprises:

first adder means, operatively connected to said main memory unit and said at least one transversal filter, for adding the first echo replica read from said main memory unit and the first output signal and for providing a first output based on the adding;

second adder means, operatively connected to said first adder means, for adding the echo component and the first output signal, for providing a second output signal based on the adding and for cancelling the echo component based on the second output signal.

19. A digital adaptive filter as claimed in claim 18, wherein said second output signal has a residual error and wherein said adding means further comprises:
third adder means for adding the residual error and the first output signal and for providing a residual echo component based on the adding; and
fourth adder means for adding the residual echo component and the first echo replica output and for providing a second residual echo component.

20. A digital adaptive filter for cancelling an echo component generated by a partial return of a transmission signal, comprising:
main tap group means for sequentially shifting the transmission signal and outputting the shifted signal in parallel;
at least one subtap group means, operatively connected to said main tap group means, for sequentially shifting the transmission signal and outputting the shifted signal in parallel;
main tap group memory means, operatively connected to said main tap group means, for storing a first echo replica which can be stored or read by using the parallel signal from said main tap group means as an address signal;
at least one subunit memory means, operatively connected to said at least one subtap group means, having one of a memory arrangement and a transversal filter arrangement, for setting a second echo replica which can be written or read by using the parallel signal from said at least one subtap group means and which has greater precision than the first echo replica stored in said main tap group memory means;
adding means, operatively connected to said main tap group memory means and said at least one subunit memory means, for adding the first echo replica read from said main tap group memory means and the second echo replica read from subunit memory means.

21. A digital adaptive filter as claimed in claim 20, wherein said main tap group mans includes means for providing an address signal, and wherein the digital adaptive filter further comprises:
convergence determination and specific pattern detection means, operatively connected to said main tap group means, for detecting whether or not the address signal represents a specific pattern, and for determining whether the transmission signal is converged when the second echo replica is written at all addresses of said main tap group memory means.

22. A digital adaptive filter as claimed in claim 20, further comprising:
convergence determining means, operatively connected to said at least one subtap group means, for determining whether the transmission signal is written at all addresses of said at least one subunit group memory means.

23. A digital adaptive filter as claimed in claim 20, wherein said main tap group memory means includes means for outputting echo components, and and said main tap group means includes means for providing first address signals, and wherein the digital adaptive filter further comprises:
echo components averaging means, operatively connected to said main tap group memory means, for averaging the echo components when the first address signals represent the specific pattern, and for writing the averaged value as the first echo replica for the specific pattern in said main tap group memory means.

24. A digital adaptive filter for cancelling an echo component generated by a partial return of a transmission signal, comprising:
main tap group means for sequentially shifting the transmission signal and outputting the shifted signal in parallel;
at least one subtap group means, operatively connected to said main tap group means, for sequentially shifting the transmission signal and outputting the shifted signal in parallel;
main tap group memory means, operatively connected to said main tap group means, for storing a first echo replica which can be stored or read by using the parallel signal from said main tap group means as an address signal;
at least one subtap group memory means, operatively connected to said at least one subtap group means, for storing a second echo replica which can be stored or read by using the parallel signal from said subtap group means as an address signal and for providing a first output having an error signal;
adding means, operatively connected to said main tap group memory means and said at least one subtap group memory means, for adding the first echo replica read from said main tap group memory means and the second echo replica read from said at least one subtap group memory means;
monitoring means, operatively connected to said main tap group memory means and said at least one subtap group memory means, for comparing an absolute value of the error signal with a predetermined positive value;
first replica updating means, operatively connected between said monitoring means and said main tap group memory means, for updating, by means of step size corresponding to the error signal when the error signal is relatively large, the first echo replica in said main tap group memory means;
second replica updating means, operatively connected between said adding means and said at least one subtap group memory means, for updating, by means of step size corresponding to the error signal the second echo replica;
the first echo replica in said main tap group memory means when the error signal is relatively small.

25. A digital adaptive filter as claimed in claim 24, wherein the second echo replica stored in said at least one subtap group memory means has a greater precision than the first echo replica stored in said main tap group memory means.

26. A digital adaptive filter as claimed in claim 24, wherein the echo component has a trailing portion and wherein said digital adaptive filter further comprises:
IIR filter portion means, for cancelling the trailing portion.

27. A method of converging in a digital adaptive filter comprising a main filter portion, including first contents, for generating main component of a pseudo signal, a subfilter portion, including second contents, for generating a subcomponent of the pseudo signal, and a synthesizing portion for synthesizing the main component and the subcomponent to generate the pseudo signal, said method comprising the steps of:

(a) receiving an input signal;

(b) updating the first contents according to a calculation based on an error between the pseudo signal and the input signal if the error is relatively large, and if the error is relatively small, updating the first contents based on a step size corresponding to the error; and (c) updating the second contents based on a step size corresponding to the error.

28. A method as claimed in claim 27, further comprising the step of:

(d) setting the precision of the subcomponent of pseudo signal greater than the precision of said main component of pseudo signal.

* * * * *

UNITED STATES PATENT AND TRADEMARK OFFICE
CERTIFICATE OF CORRECTION

PATENT NO. : 5,007,044
DATED : April 9, 1991
INVENTOR(S) : Miyoshi et al.

It is certified that error appears in the above-identified patent and that said Letters Patent is hereby corrected as shown below:

Col. 6, line 11, delete "(e.g.";

Col. 6, line 12, delete "hybrid unit)";

Col. 13, line 40, change "16" to --6--.

Signed and Sealed this

Fifteenth Day of December, 1992

Attest:

DOUGLAS B. COMER

*Attesting Officer*  *Acting Commissioner of Patents and Trademarks*